US011908927B2

(12) United States Patent
Otake et al.

(10) Patent No.: US 11,908,927 B2
(45) Date of Patent: Feb. 20, 2024

(54) NITRIDE SEMICONDUCTOR DEVICE

(71) Applicant: ROHM CO., LTD., Kyoto (JP)

(72) Inventors: Hirotaka Otake, Kyoto (JP); Shinya Takado, Kyoto (JP); Kentaro Chikamatsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 386 days.

(21) Appl. No.: 17/433,146

(22) PCT Filed: Jan. 23, 2020

(86) PCT No.: PCT/JP2020/002354
§ 371 (c)(1),
(2) Date: Aug. 23, 2021

(87) PCT Pub. No.: WO2020/174956
PCT Pub. Date: Sep. 3, 2020

(65) Prior Publication Data
US 2022/0181477 A1    Jun. 9, 2022

(30) Foreign Application Priority Data

Feb. 28, 2019  (JP) ................................ 2019-036271

(51) Int. Cl.
*H01L 29/778*        (2006.01)
*H01L 29/20*         (2006.01)
(Continued)

(52) U.S. Cl.
CPC ...... *H01L 29/7786* (2013.01); *H01L 29/2003* (2013.01); *H01L 29/205* (2013.01);
(Continued)

(58) Field of Classification Search
CPC ............ H01L 29/7786; H01L 29/2003; H01L 29/205; H01L 29/401; H01L 29/42316;
(Continued)

(56) References Cited

U.S. PATENT DOCUMENTS

2010/0258841 A1    10/2010   Lidow et al.
2012/0068227 A1*    3/2012   Hikita ............... H01L 29/42316
                                                          257/E29.246
(Continued)

FOREIGN PATENT DOCUMENTS

JP    2000340580    12/2000
JP    2012064900     3/2012
(Continued)

OTHER PUBLICATIONS

International Search Report and Written Opinion issued for International Patent Application No. PCT/JP2020/002354, dated Mar. 31, 2020, 11 pages including English translation of Search Report.
(Continued)

*Primary Examiner* — Mohammed R Alam
(74) *Attorney, Agent, or Firm* — XSENSUS LLP

(57) ABSTRACT

A nitride semiconductor device 1 includes a first nitride semiconductor layer 13 that constitutes an electron transit layer, a second nitride semiconductor layer 14 that is formed on the first nitride semiconductor layer and constitutes an electron supply layer, a nitride semiconductor gate layer 15 that is disposed on the second nitride semiconductor layer, has a ridge portion 15A at least at a portion thereof, and contains an acceptor type impurity, a gate electrode 4 that is disposed at least on the ridge portion of the nitride semiconductor gate layer, a source electrode 3 that is disposed on the second nitride semiconductor layer and has a source principal electrode portion 3A parallel to the ridge portion, and a drain electrode 5 that is disposed on the second nitride semiconductor layer and has a drain principal electrode portion 5A parallel to the ridge portion. A length direction of the ridge portion is a [110] direction of a semiconductor crystal structure that constitutes the second nitride semiconductor layer.

16 Claims, 24 Drawing Sheets

(51) Int. Cl.
*H01L 29/205* (2006.01)
*H01L 29/40* (2006.01)
*H01L 29/423* (2006.01)
*H01L 29/66* (2006.01)

(52) U.S. Cl.
CPC ...... *H01L 29/401* (2013.01); *H01L 29/42316* (2013.01); *H01L 29/66462* (2013.01)

(58) Field of Classification Search
CPC ............. H01L 29/66462; H01L 29/045; H01L 29/1066; H01L 29/41758; H01L 29/402; H01L 21/28
See application file for complete search history.

(56) References Cited

U.S. PATENT DOCUMENTS

| | | | |
|---|---|---|---|
| 2014/0209922 A1 | 7/2014 | Ota et al. | |
| 2016/0336437 A1* | 11/2016 | Kajitani | H01L 29/7786 |
| 2017/0104091 A1 | 4/2017 | Tanaka | |

FOREIGN PATENT DOCUMENTS

| | | |
|---|---|---|
| JP | 2012523700 | 10/2012 |
| JP | 2014146744 | 8/2014 |
| JP | 2017073506 | 4/2017 |
| WO | 2015125471 | 8/2015 |

OTHER PUBLICATIONS

International Preliminary Report on Patentability issued for International Patent Application No. PCT/JP2020/002354, dated Sep. 10, 2021, 16 pages including English translation.

Notice of Reasons for Refusal issued for Japanese Patent Application No. 2021-501748, dated May 11, 2023, 5 pages including English machine translation.

* cited by examiner

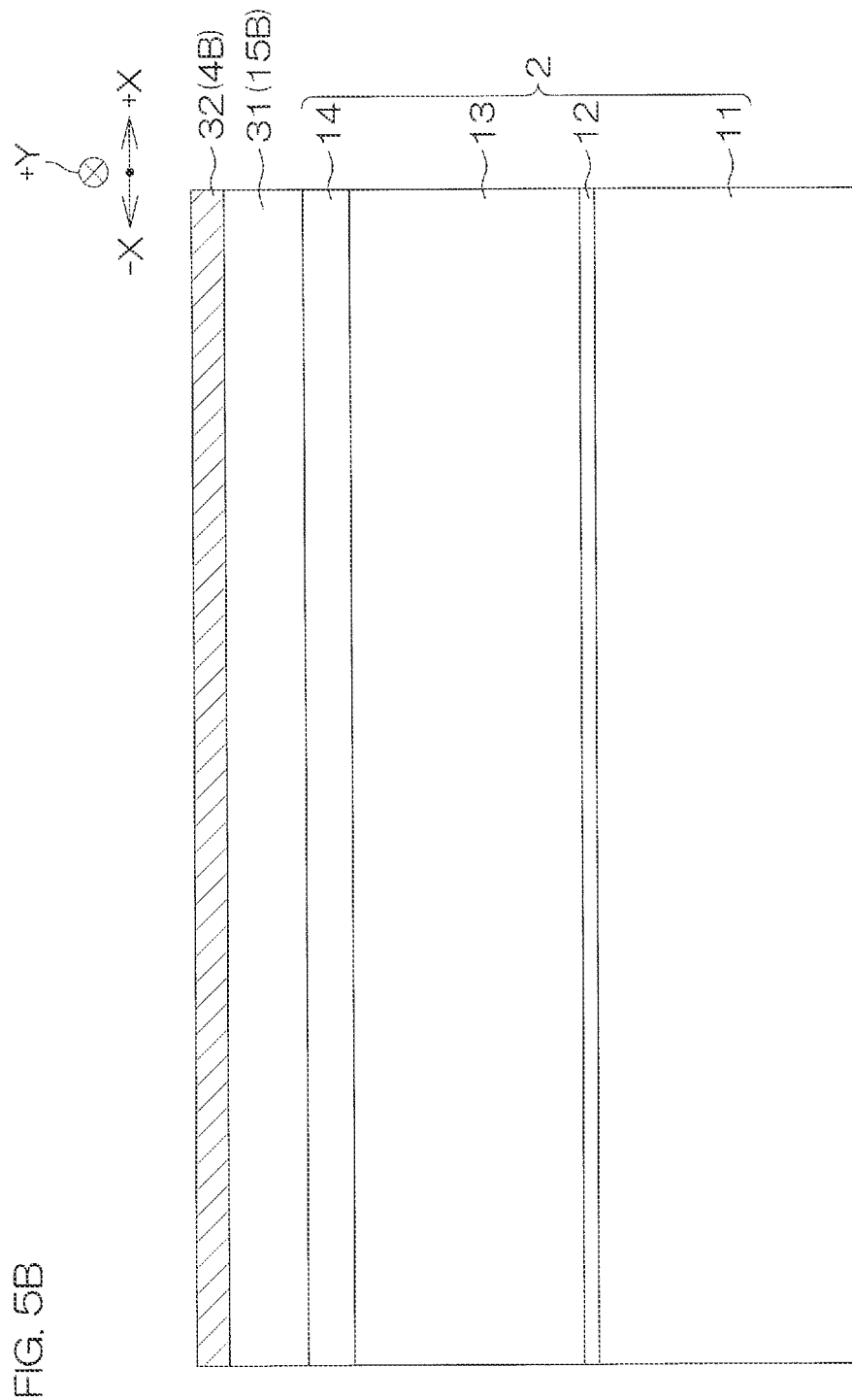

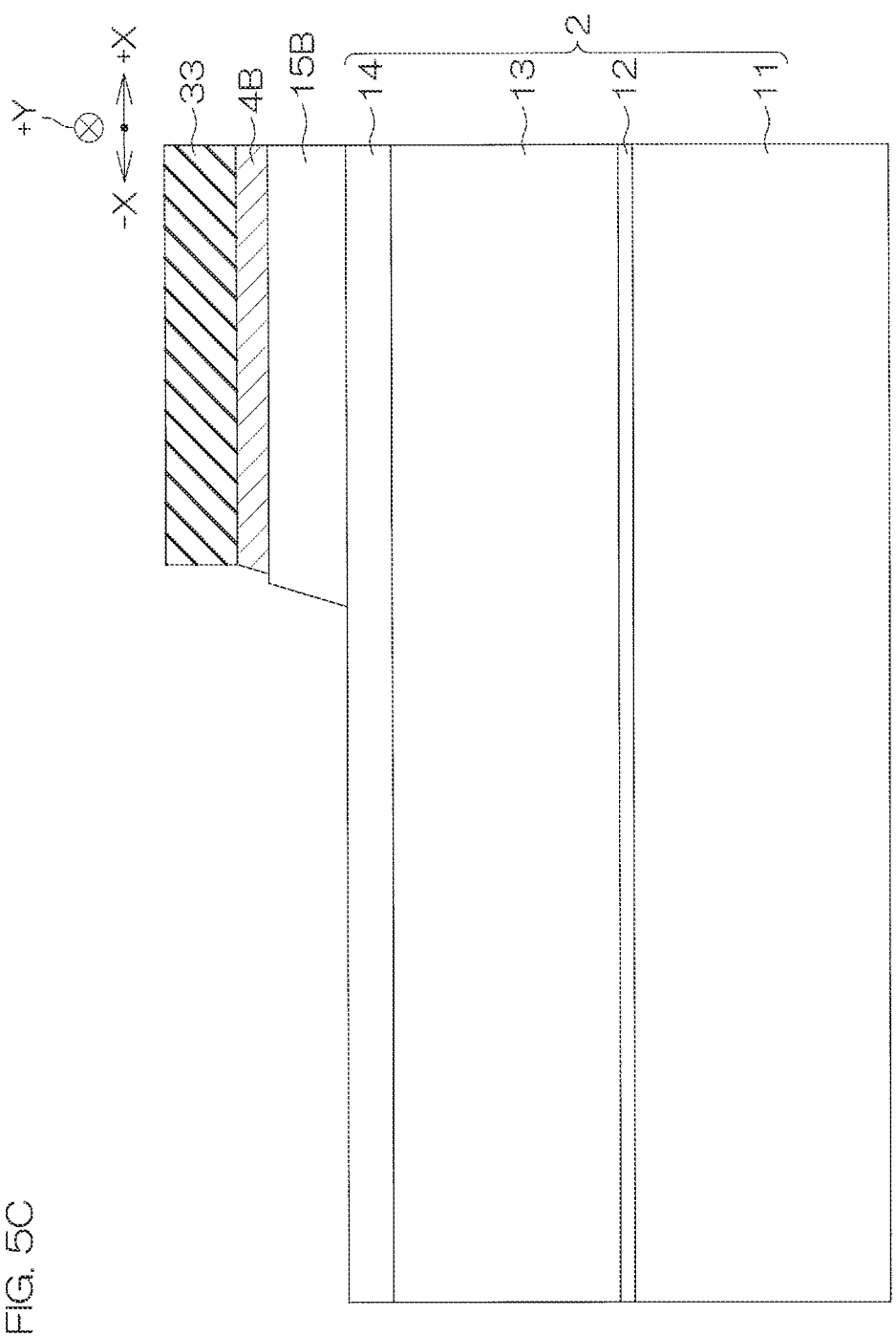

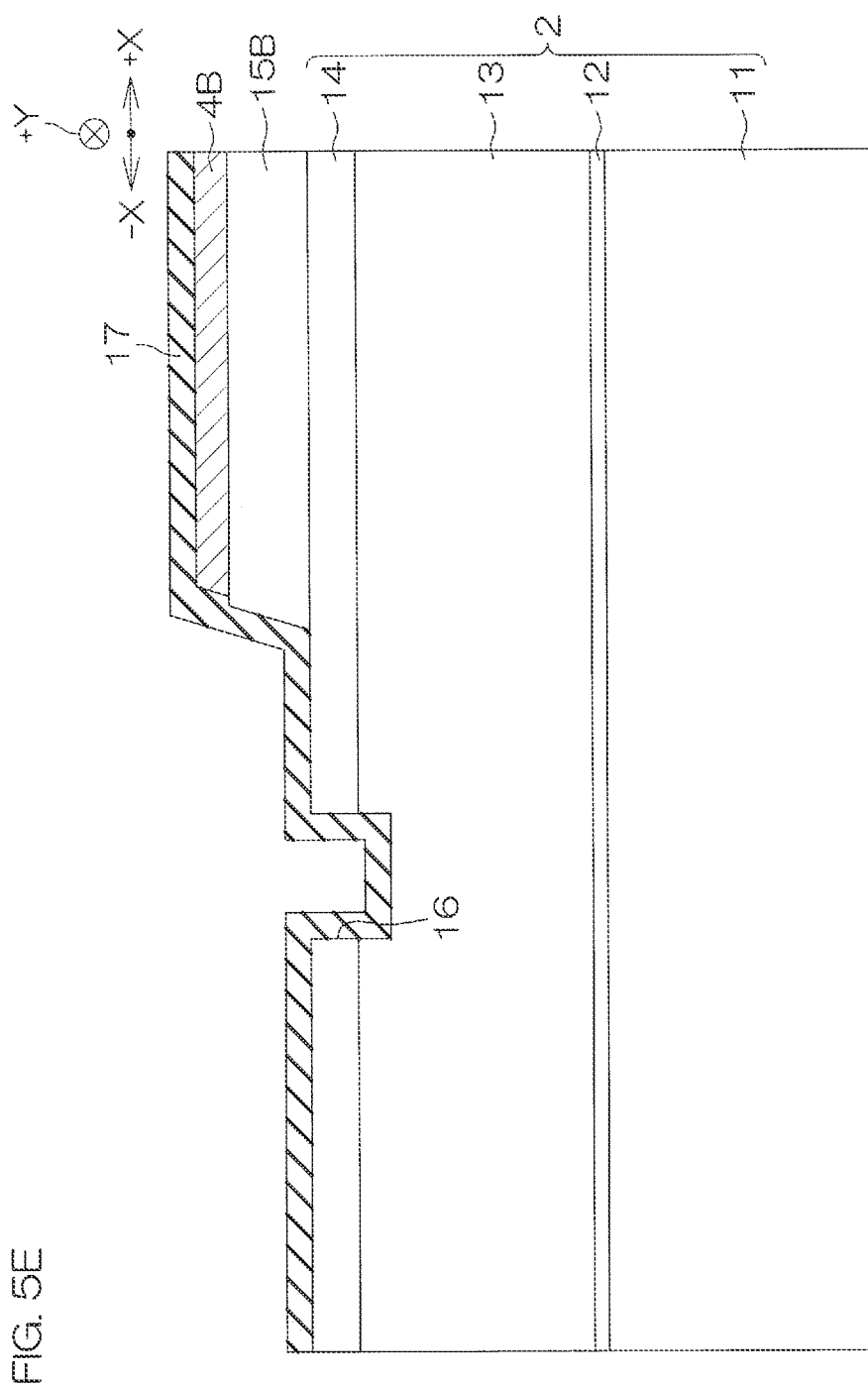

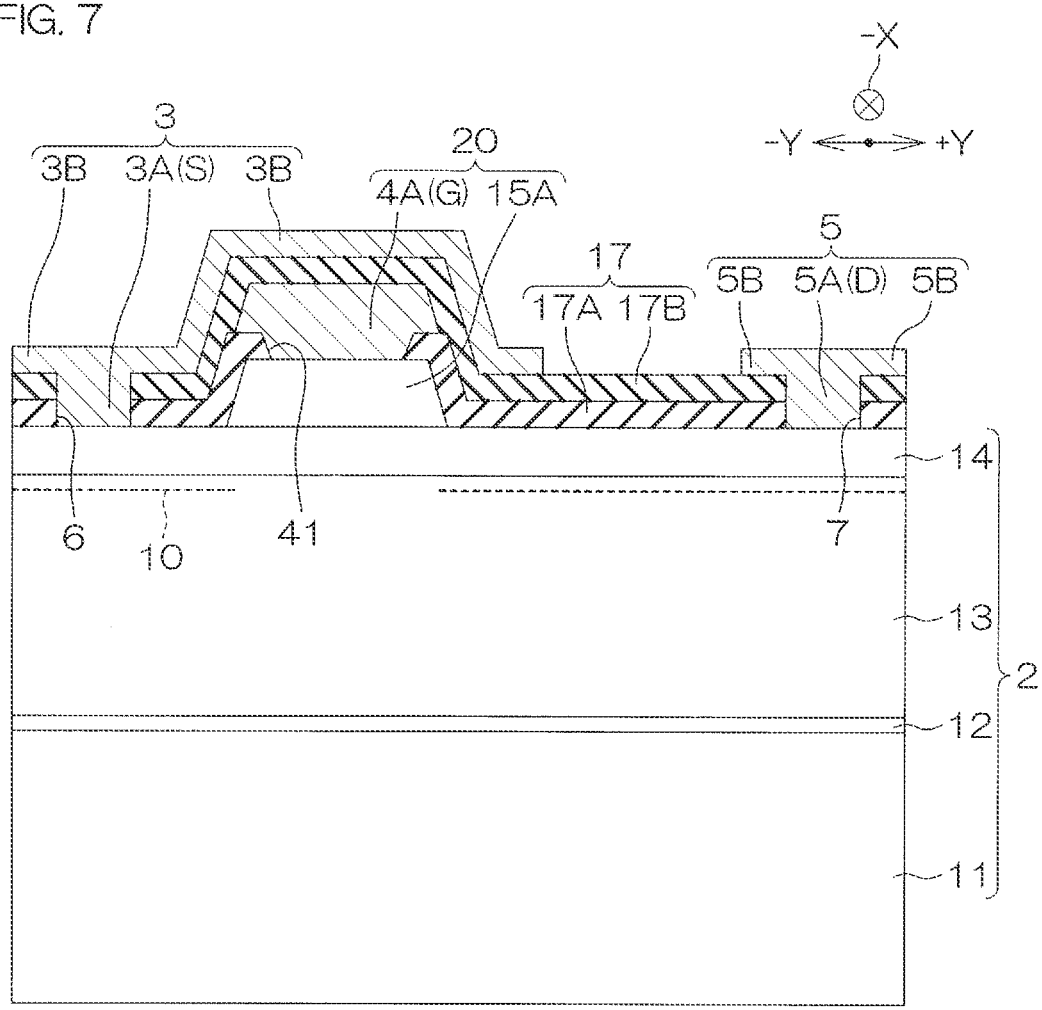

1C

NITRIDE SEMICONDUCTOR DEVICE

TECHNICAL FIELD

The present invention relates to a nitride semiconductor device that is constituted of a group III nitride semiconductor (hereinafter referred to at times simply as "nitride semiconductor").

BACKGROUND ART

A group III nitride semiconductor is a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \leq x \leq 1$, $0 \leq y \leq 1$, $0 \leq x+y \leq 1$).

An HEMT (high electron mobility transistor) using such a nitride semiconductor has been proposed. Such an HEMT includes, for example, an electron transit layer constituted of GaN and an electron supply layer constituted of an AlGaN epitaxially grown on the electron transit layer. A pair of source electrode and drain electrode are formed such as to contact the electron supply layer and a gate electrode is disposed therebetween.

Due to polarization caused by lattice mismatch of GaN and the AlGaN, a two-dimensional electron gas is formed at a position inside the electron transit layer that is only a few Å inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other. The source and the drain are made conductive to each other in a state where the control voltage is not applied to the gate electrode and therefore the device is of a normally-on type.

Devices using a nitride semiconductor have features of high withstand voltage, high temperature operation, high current density, high speed switching, and low on resistance and are thus being examined for application to power devices.

However, for use as a power device, a device must be of a normally-off type that interrupts current at zero bias and therefore, an HEMT such as described above cannot be applied to a power device.

A structure for realizing a nitride semiconductor HEMT of the normally-off type has been proposed, for example, in Patent Literature 1.

CITATION LIST

Patent Literature

Patent Literature 1: Japanese Patent Application Publication No. 2017-73506

SUMMARY OF INVENTION

Technical Problem

Patent Literature 1 discloses an arrangement where a p type GaN gate layer (nitride semiconductor gate layer) of a ridge shape is laminated on an AlGaN electron supply layer, a gate electrode is disposed thereon, and a channel is eliminated by a depletion layer spreading from the p type GaN gate layer to achieve a normally-off operation.

With such an arrangement, agate leak current flows from the gate electrode to the source electrode via the p type GaN layer of ridge shape. If the gate leak current is large, this leads to such problems as not being able to secure a gate voltage necessary for obtaining a desired on resistance or power consumption by a gate drive circuit increasing, and there is concern about decrease in efficiency and increase in heat generation in a power circuit and a control circuit portion. This is a large issue for an HEMT that features high frequency switching.

An object of the present invention is to provide a nitride semiconductor device with which a gate leak current can be reduced.

Solution to Problem

A nitride semiconductor device according to a preferred embodiment of the present invention includes a first nitride semiconductor layer that constitutes an electron transit layer, a second nitride semiconductor layer that is formed on the first nitride semiconductor layer and constitutes an electron supply layer, a nitride semiconductor gate layer that is disposed on the second nitride semiconductor layer, has a ridge portion at least at a portion thereof, and contains an acceptor type impurity, a gate electrode that is disposed at least on the ridge portion of the nitride semiconductor gate layer, a source electrode that is disposed on the second nitride semiconductor layer and has a source principal electrode portion parallel to the ridge portion, and a drain electrode that is disposed on the second nitride semiconductor layer and has a drain principal electrode portion parallel to the ridge portion, and where a length direction of the ridge portion is a [110] direction of a semiconductor crystal structure that constitutes the second nitride semiconductor layer.

With this arrangement, the length direction of the ridge portion is the [110] direction of the semiconductor crystal structure that constitutes the second nitride semiconductor layer and therefore, a gate leak current can be reduced.

In the preferred embodiment of the present invention, in plan view, the nitride semiconductor gate layer is disposed such as to surround the source principal electrode portion and the nitride semiconductor gate layer has a pair of the ridge portions that are respectively disposed at both sides of the source principal electrode portion and a ridge coupling portion that couples corresponding end portions of the ridge portions to each other.

In the preferred embodiment of the present invention, the gate electrode has a pair of gate principal electrode portions that are respectively formed on the pair of ridge portions and a base portion that is formed on the ridge coupling portion and couples corresponding end portions of the pair of gate principal electrode portions to each other.

In the preferred embodiment of the present invention, at both sides of the source principal electrode portion, the gate principal electrode portions and the drain principal electrode portions are disposed in that order from sides closer to the source principal electrode portion.

In the preferred embodiment of the present invention, a ratio of an interval between the pair of ridges with respect to a length in a length direction of the ridges is not more than 1/100.

In the preferred embodiment of the present invention, an inclination angle of opposing walls of two ridge coupling portions at both end sides of the pair of ridges is substantially equal to an inclination angle of lateral walls of the ridges.

In the preferred embodiment of the present invention, a two-dimensional electron gas dividing portion is formed between an end portion of the source principal electrode portion and the corresponding ridge coupling portion inside a region in which the nitride semiconductor gate layer surrounds the source principal electrode portion.

In the preferred embodiment of the present invention, an insulating film is interposed between the nitride semiconductor gate layer and the gate electrode.

In the preferred embodiment of the present invention, a lateral wall along the length direction of the ridge is a (10-12) plane.

In the preferred embodiment of the present invention, a lateral wall along the length direction of the ridge is an inclined surface that is inclined with respect to a front surface of the second nitride semiconductor layer and an inclination angle of the inclined surface with respect to the front surface of the second nitride semiconductor layer is not less than 80 degrees but less than 90 degrees.

In the preferred embodiment of the present invention, a lateral wall along the length direction of the ridge is perpendicular to a front surface of the second nitride semiconductor layer.

In the preferred embodiment of the present invention, the first nitride semiconductor layer is constituted of a GaN layer, the second nitride semiconductor layer is constituted of an Al—Ga$_{(1-x)}$N (0<x<1) layer, and the nitride semiconductor gate layer is constituted of a p type GaN layer.

A method for manufacturing a nitride semiconductor device according to a preferred embodiment of the present invention includes a first step of forming a first nitride semiconductor layer that constitutes an electron transit layer, a second nitride semiconductor layer that constitutes an electron supply layer, and a nitride semiconductor gate layer material film that contains an acceptor type impurity in that order on a substrate, a second step of forming a gate electrode film that is a material film of a gate electrode on the nitride semiconductor gate layer material film, a third step of patterning the gate electrode film and the nitride semiconductor gate layer material film by etching to form a nitride semiconductor gate layer that has a pair of mutually parallel ridge portions and a ridge coupling portion coupling corresponding end portions thereof to each other and a gate electrode that has a gate principal electrode portion formed on the ridge portions, and a fourth step of forming, on the electron supply layer, a source electrode that includes a source principal electrode portion disposed inside a region between the pair of ridge portions such as to be parallel to the ridge portions and at the same time forming a drain electrode that includes a drain principal electrode portion disposed inside a region at an outer side of the pair of ridge portions such as to be parallel to the ridge portions, and where a length direction of the ridges is a [110] direction of a semiconductor crystal structure that constitutes the second nitride semiconductor layer.

With this manufacturing method, a nitride semiconductor device is obtained with which a gate leak current can be reduced.

In the preferred embodiment of the present invention, the second nitride semiconductor layer is constituted of an Al—Ga$_{(1-x)}$N (0<x<1) layer.

In the preferred embodiment of the present invention, in the third step, the nitride semiconductor gate layer material film is patterned by dry etching.

In the preferred embodiment of the present invention, in the third step, the nitride semiconductor gate layer material film is patterned by dry etching and wet etching following the dry etching.

The aforementioned as well as yet other objects, features, and effects of the present invention will be made clear by the following description of the preferred embodiments made with reference to the accompanying drawings.

BRIEF DESCRIPTION OF DRAWINGS

FIG. 5B is a sectional view of a step subsequent to that of FIG. 5A.

FIG. 5C is a sectional view of a step subsequent to that of FIG. 5B.

FIG. 5E is a sectional view of a step subsequent to that of FIG. 5D.

FIG. 7 is a sectional view for describing the arrangement of a nitride semiconductor device according to a second preferred embodiment of the present invention and is a sectional view corresponding to FIG. 2.

DESCRIPTION OF EMBODIMENTS

In the following, preferred embodiments of the present invention shall be described in detail with reference to the attached drawings.

Figure 1:
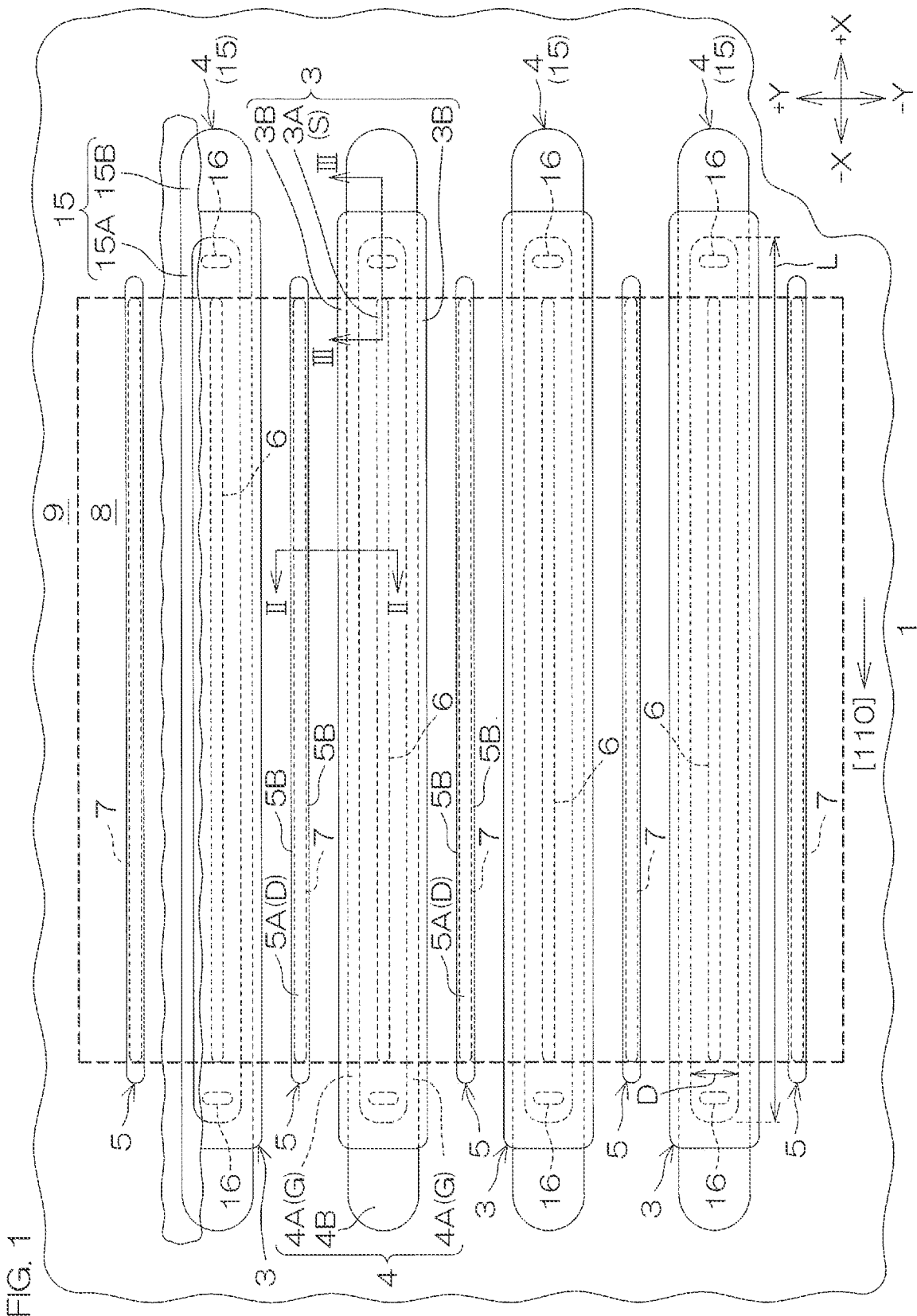
FIG. 1 is a partial plan view for describing the arrangement of a nitride semiconductor device according to a first preferred embodiment of the present invention.
Figure 2:
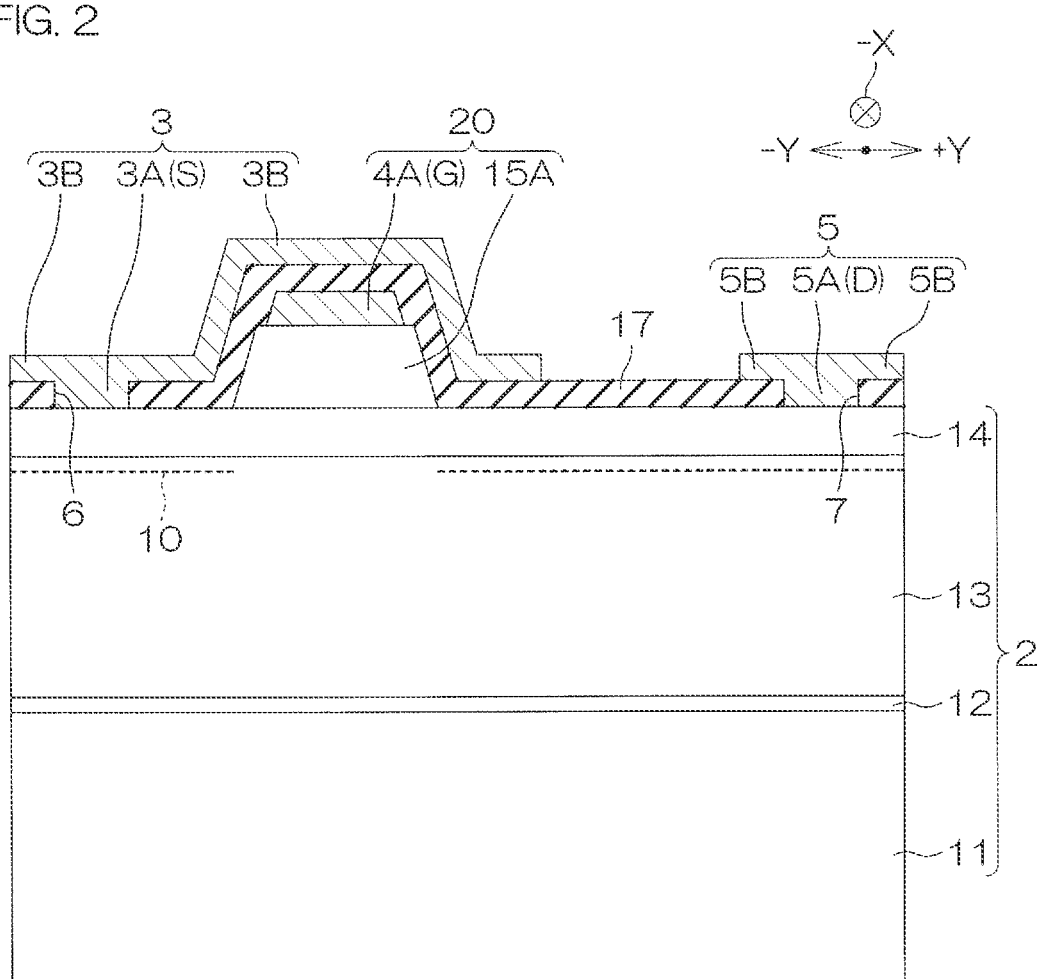
FIG. 2 is an enlarged sectional view taken along line II-II of FIG. 1.
Figure 3:
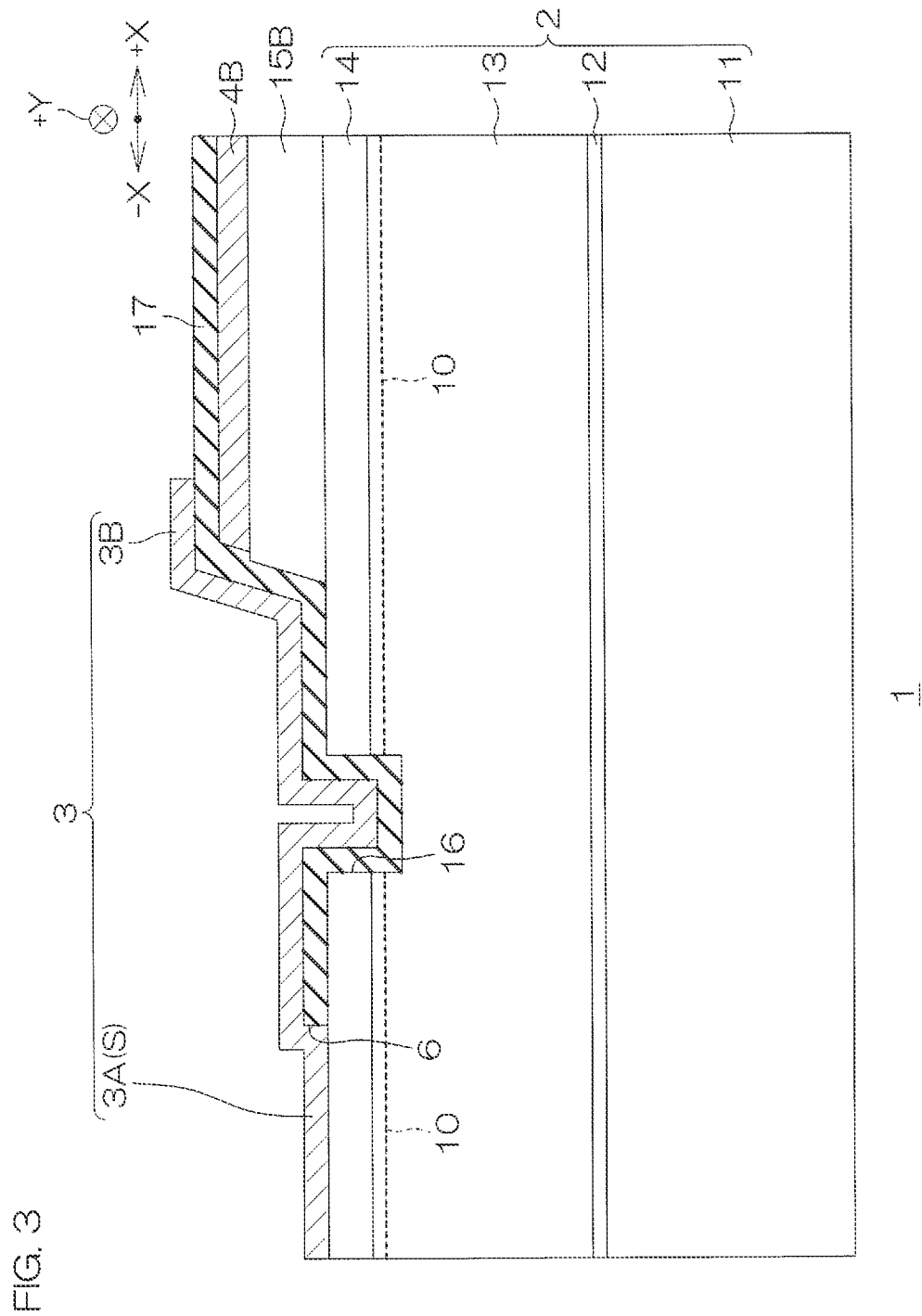
FIG. 3 is an enlarged sectional view taken along line III-III of FIG. 1.

FIG. 1 is a partial plan view for describing the arrangement of a nitride semiconductor device according to a first preferred embodiment of the present invention. FIG. 2 is an enlarged sectional view taken along line II-II of FIG. 1. FIG. 3 is an enlarged sectional view taken along line III-III of FIG. 1.

For convenience of description, a +X direction, a −X direction, a +Y direction, and a −Y direction shown in FIG. 1, FIG. 2, and FIG. 3 are used at times in the following description. The +X direction is a predetermined direction along a front surface of the semiconductor device 1 in plan view and the +Y direction is a direction along the front surface of the semiconductor device 1 and is a direction that is orthogonal to the +X direction. The −X direction is a direction opposite to the +X direction and the −Y direction is a direction opposite to the +Y direction. The +X direction and the −X direction shall be referred to simply as the "X direction" when referred to collectively, and the +Y direction and the −Y direction shall be referred to simply as the "Y direction" when referred to collectively.

The nitride semiconductor device 1 includes a semiconductor laminated structure (nitride semiconductor structure) 2 and an electrode metal structure disposed on the semiconductor laminated structure 2.

As shown in FIG. 1, the electrode metal structure includes a plurality of source electrodes 3, a plurality of gate electrodes 4, and a plurality of drain electrode 5. The source electrodes 3 and the drain electrodes 5 extend in the X direction. Each gate electrode 4 includes a pair of gate principal electrode portions 4A that extend mutually in parallel in the X direction and two base portions 4B that respectively couple corresponding end portions of the pair of gate principal electrode portions 4A to each other.

A single source electrode 3 is formed such as to cover the pair of gate principal electrode portions 4A of a single gate electrode 4 in plan view. The source electrode 3 includes, in plan view, a source principal electrode portion 3A that is disposed between lengthwise intermediate portions of the pair of gate principal electrode portions 4A and an extension portion 3B at a periphery of the source principal electrode portion 3A. In this preferred embodiment, the source principal electrode portion 3A shall refer to a region among an entire region of the source electrode 3 that is surrounded by an outline of a source contact hole 6 in plan view. The extension portion 3B refers to a portion of the entire region of the source electrode 3 other than the source principal electrode portion 3A in plan view. The source contact hole 6 shall be described later. The extension portion 3B covers the pair of gate principal electrode portions 4A and portions of the two base portions 4B.

A drain electrode 5 is disposed at each of both sides of a single source electrode 3. The drain electrode 5 is constituted, in plan view, of a drain principal electrode portion 5A that is an intermediate portion in a length direction and a width direction and an extension portion 5B at a periphery of the drain principal electrode portion 5A. In this preferred embodiment, the drain principal electrode portion 5A shall refer to a region among an entire region of the drain electrode 5 that is surrounded by an outline of a drain contact hole 7 in plan view. The drain contact hole 7 shall be described later. The extension portion 5B refers to a portion of the entire region of the drain electrode 5 other than the drain principal electrode portion 5A in plan view.

In the example of FIG. 1, the source principal electrode portions 3A (S), the gate principal electrode portions 4A (G), and the drain principal electrode portions 5A (D) are disposed cyclically in an order of DGSGDGS in the Y direction. Thereby, element structures are arranged by each gate principal electrode portion 4A (G) being sandwiched by a source principal electrode portion 3A (S) and a drain principal electrode portion 5A (D). A region of a front surface on the semiconductor laminated structure 2 is constituted of an active area 8 that includes the element structures and a nonactive area 9 at an outer side of the active area 8. The base portions 4B of each gate electrode 4 respectively couple the corresponding end portions of the plurality of gate principal electrode portions 4A to each other in the nonactive area 9.

As shown in FIG. 2 and FIG. 3, the semiconductor laminated structure 2 includes a substrate 11, a buffer layer 12 that is formed on a front surface of the substrate 11, a first nitride semiconductor layer 13 that is epitaxially grown on the buffer layer 12, and a second nitride semiconductor layer 14 that is epitaxially grown on the first nitride semiconductor layer 13.

The substrate 11 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 11 may instead be an SiC substrate of low resistance, a GaN substrate of low resistance, etc. The substrate 11 has a thickness, for example, of approximately 650 μm during a semiconductor process and is ground to not more than approximately 300 μm in a preliminary stage before being made into a chip. The substrate 11 is electrically connected to the source electrode 3.

In this preferred embodiment, the buffer layer 12 is constituted of a multilayer buffer layer in which a plurality of nitride semiconductor films are laminated. In this preferred embodiment, the buffer layer 12 is constituted of a first buffer layer (not shown) constituted of an AlN film in contact with the front surface of the substrate 11 and a second buffer layer (not shown) constituted of an AlN/AlGaN superlattice layer laminated on a front surface of the first buffer layer (the front surface at an opposite side to the substrate 11 side). A film thickness of the first buffer layer is approximately 100 nm to 500 nm. A film thickness of the second buffer layer is approximately 500 nm to 2 μm. The buffer layer 12 may instead be constituted, for example, of a single film or a composite film of AlGaN.

The first nitride semiconductor layer 13 constitutes an electron transit layer. In this preferred embodiment, the first nitride semiconductor layer 13 is constituted of a GaN layer and a thickness thereof is approximately 0.5 μm to 2 μm. Also, an impurity for making a region other than a front surface region semi-insulating may be introduced for a purpose of suppressing a leak current that flows through the first nitride semiconductor layer 13. In this case, a concentration of the impurity is preferably not less than $4 \times 10^{16}$ cm$^{-3}$. Also, the impurity is, for example, C or Fe.

The second nitride semiconductor layer 14 constitutes an electron supply layer. The second nitride semiconductor layer 14 is constituted of a nitride semiconductor with a larger bandgap than the first nitride semiconductor layer 13. In this preferred embodiment, the second nitride semiconductor layer 14 is constituted of a nitride semiconductor with a higher Al composition than the first nitride semiconductor layer 13. In a nitride semiconductor, the higher the Al composition, the larger the bandgap. In this preferred embodiment, the second nitride semiconductor layer 14 is constituted of an $Al_{x1}Ga_{1-x1}N$ layer (0<x1<1) and a thickness thereof is approximately 5 nm to 15 nm.

The first nitride semiconductor layer (electron transit layer) 13 and the second nitride semiconductor layer (electron supply layer) 14 are thus constituted of nitride semiconductors that differ in bandgap (Al composition) and a lattice mismatch occurs therebetween. Also, due to spontaneous polarizations of the first nitride semiconductor layer 13 and the second nitride semiconductor layer 14 and a piezo polarization due to the lattice mismatch between the two, an energy level of a conduction band of the first nitride semiconductor layer 13 at an interface between the first nitride semiconductor layer 13 and the second nitride semiconductor layer 14 is made lower than a Fermi level. Thereby, inside the first nitride semiconductor layer 13, a two-dimensional electron gas (2DEG) 10 spreads at a position close to the interface between the first nitride semiconductor layer 13 and the second nitride semiconductor layer 14 (for example, at a distance of approximately several A from the interface).

A nitride semiconductor gate layer 15 is interposed between the second nitride semiconductor layer 14 and the gate electrode 4. The nitride semiconductor gate layer 15 is formed by epitaxial growth on a front surface of the second nitride semiconductor layer 14. The nitride semiconductor gate layer 15 has substantially the same shape as the gate electrode 4 in plan view. Specifically, the nitride semiconductor gate layer 15 includes a pair of ridge portions 15A that extend mutually in parallel in the X direction and two ridge coupling portions 15B that respectively couple corresponding end portions of the pair of ridge portions 15A to each other.

As shown in FIG. 2 and FIG. 3, the gate principal electrode portions 4A of the gate electrode 4 are formed on the ridge portions 15A of the nitride semiconductor gate layer 15 and the base portions 4B of the gate electrode 4 are formed on the ridge coupling portions 15B of the nitride semiconductor gate layer 15. Therefore, as shown in FIG. 1, in plan view, the nitride semiconductor gate layer 15, like the gate electrode 4, is formed such as to surround the source principal electrode portion 3A. That is, the gate electrode 4 and the nitride semiconductor gate layer 15 are each formed to an annular shape in plan view. As shown in FIG. 2, a gate portion 20 is formed by each ridge portion 15A of the nitride semiconductor gate layer 15 and the gate principal electrode portion 4A of the gate electrode 4 that is formed thereon.

In this preferred embodiment, a length direction (X direction) of each ridge portion 15A is a [110] direction of a semiconductor crystal structure that constitutes the second nitride semiconductor layer 14. Also, in this preferred embodiment, a lateral cross-sectional shape of the ridge portion 15A is a trapezoidal shape. That is, side surfaces of the ridge portion 15A are inclined surfaces that are inclined with respect to the front surface of the second nitride semiconductor layer 14. Also, in the present preferred embodiment, the side surfaces of the ridge portion 15A are substantially (10-12) planes.

Referring to FIG. 1, a ratio D/L of an interval D between each pair of ridge portions 15A with respect to a length L of each ridge portion 15A is approximately 1/250. The ratio D/L of the interval D between each pair of ridge portions 15A with respect to the length L of each ridge portion 15A is preferably not more than 1/100. The reason for this is because when the ratio D/L is not more than 1/100, a gate leak current that flows from the base portions 4B of the gate electrode 4 to the source electrode 3 via the ridge coupling portions 15B of the nitride semiconductor gate layer 15 can be reduced.

The nitride semiconductor gate layer 15 is constituted of a nitride semiconductor that is doped with an acceptor type impurity. In this preferred embodiment, the nitride semiconductor gate layer 15 is constituted of a GaN layer (p type GaN layer) doped with the acceptor type impurity and a thickness thereof is approximately 40 nm to 100 nm. A concentration of the acceptor type impurity implanted in the nitride semiconductor gate layer 15 is preferably not less than $1 \times 10^{19}$ cm$^{-3}$. In this preferred embodiment, the acceptor type impurity is Mg (magnesium). The acceptor type impurity may instead be Zn (zinc) or other acceptor type impurity besides Mg. The nitride semiconductor gate layer 15 is provided to cancel out the two-dimensional electron gas 10 formed near the interface between the first nitride semiconductor layer (electron transit layer) 13 and the second nitride semiconductor layer (electron supply layer) 14 in a region directly below the gate portion 20.

In this preferred embodiment, the gate electrode 4 is constituted of TiN. A film thickness of the gate electrode 4 is approximately 50 nm to 200 nm.

Referring to FIG. 1 and FIG. 3, in plan view, inside a region in which the nitride semiconductor gate layer 15 surrounds the source principal electrode portion 3A, a two-dimensional electron gas dividing groove 16 is formed in the front surface of the second nitride semiconductor layer 14 in each of regions between respective end portions of the source principal electrode portion 3A and the ridge coupling portions 15B corresponding to the end portions. The two-dimensional electron gas dividing groove 16 reaches an interior of the first nitride semiconductor layer 13 and divides the two-dimensional electron gas 10. In plan view, the two-dimensional electron gas dividing groove 16 is of a rectangular shape that is long in the Y direction. The two-dimensional electron gas dividing groove 16 is an example of a two-dimensional electron gas dividing portion of the present invention.

As shown in FIG. 2 and FIG. 3, a passivation film that covers exposed surfaces of the second nitride semiconductor layer 14, the nitride semiconductor gate layers 15, and the gate electrodes 4 is formed on the second nitride semiconductor layer 14. Therefore, side surfaces and a front surface of each gate portion 20 are covered by the passivation film 17. In this preferred embodiment, the passivation film 17 is constituted of an SiN film and a thickness thereof is approximately 50 nm to 200 nm. The passivation film 17 may be constituted of SiN, $SiO_2$, SiON, or a composite film of these.

The source contact holes 6 and the drain contact holes 7 are formed in the passivation film 17. The source contact holes 6 and the drain contact holes 7 are formed in a configuration of sandwiching the gate portions 20.

The source principal electrode portions 3A of the source electrodes 3 penetrate through the source contact holes 6 to be in ohmic contact with the second nitride semiconductor layer 14. As shown in FIG. 1 and FIG. 2, in the active area 8, the extension portions 3B of the source electrodes 3 cover the gate portions 20 (gate principal electrode portions 4A). As shown in FIG. 1 and FIG. 3, in the nonactive area 9, portions of the extension portions 3B of the source electrodes 3 cover portions of the base portions 4B of the gate electrodes 4. Also, in the nonactive area 9, portions of the extension portions 3B of the source electrodes 3 enter inside two-dimensional electron gas dividing grooves 16. The drain principal electrode portions 5A of the drain electrodes 5 penetrate through the drain contact holes 7 to be in ohmic contact with the second nitride semiconductor layer 14.

The source electrodes 3 and the drain electrodes 5 are each constituted, for example, of a first metal layer (ohmic metal layer) that is in contact with the second nitride semiconductor layer 14, a second metal layer (principal electrode metal layer) that is laminated on the first metal layer, a third metal layer (adhesion layer) that is laminated on the second metal layer, and a fourth metal layer (barrier metal layer) that is laminated on the third metal layer. The first metal layer is, for example, a Ti layer with a thickness of approximately 10 nm to 20 nm. The second metal layer is, for example, an Al layer with a thickness of approximately 100 nm to 300 nm. The third metal layer is, for example, a Ti layer with a thickness of approximately 10 nm to 20 nm. The fourth metal layer is, for example, a TiN layer with a thickness of approximately 10 nm to 50 nm.

In the nitride semiconductor device 1, a heterojunction is formed by there being formed on the first nitride semiconductor layer (electron transit layer) 13, the second nitride semiconductor layer (electron supply layer) 14 that differs in bandgap (Al composition). The two-dimensional electron gas 10 is thereby formed inside the first nitride semiconductor layer 13 near the interface between the first nitride semiconductor layer 13 and the second nitride semiconductor layer 14, and an HEMT making use of the two-dimensional electron gas 10 as a channel is formed. The gate principal electrode portions 4A of the gate electrodes 4 oppose the second nitride semiconductor layer 14 across the ridge portions 15A of the nitride semiconductor gate layers 15.

Below the gate principal electrode portions 4A, energy levels of the first nitride semiconductor layer 13 and the second nitride semiconductor layer 14 are pulled up by the ionized acceptors contained in the ridge portions 15A that are constituted of the p type GaN layers. The energy level of the conduction band at the heterojunction interface between the first nitride semiconductor layer 13 and the second nitride semiconductor layer 14 is thus made higher than the Fermi level. Therefore, the two-dimensional electron gas 10 due to the spontaneous polarizations of the first nitride semiconductor layer 13 and the second nitride semiconductor layer 14 and the piezo polarization due to the lattice mismatch of the two layers is not formed directly below the gate principal electrode portions 4A (gate portions 20).

Therefore, when a bias is not applied to the gate electrodes 4 (zero bias state), the channel due to the two-dimensional electron gas 10 is interrupted directly below the gate principal electrode portions 4A. A normally-off type HEMT is thus realized. When an appropriate on voltage (for example, of 5 V) is applied to the gate electrodes 4, channels are induced inside the first nitride semiconductor layer 13 directly below the gate principal electrode portions 4A and the two-dimensional electron gas 10 at both sides of each gate principal electrode portion 4A becomes connected. A source and a drain are thereby made continuous to each other.

For use, for example, a predetermined voltage (for example, of 10 V to 500 V) with which the drain electrode 5 side becomes positive is applied between the source electrodes 3 and the drain electrodes 5. In this state, an off voltage (0 V) or the on voltage (5 V) is applied to the gate electrodes 4 with the source electrodes 3 being at a reference potential (0 V).

FIG. 4A to FIG. 4G and FIG. 5A to FIG. 5G are sectional views for describing an example of a manufacturing process of the nitride semiconductor device 1 described above and show the cross-sectional structure at a plurality of stages in the manufacturing process. FIG. 4A to FIG. 4G are sectional views corresponding to the section plane of FIG. 2 and FIG. 5A to FIG. 5G are sectional views corresponding to the section plane of FIG. 3.

Figure 4A:
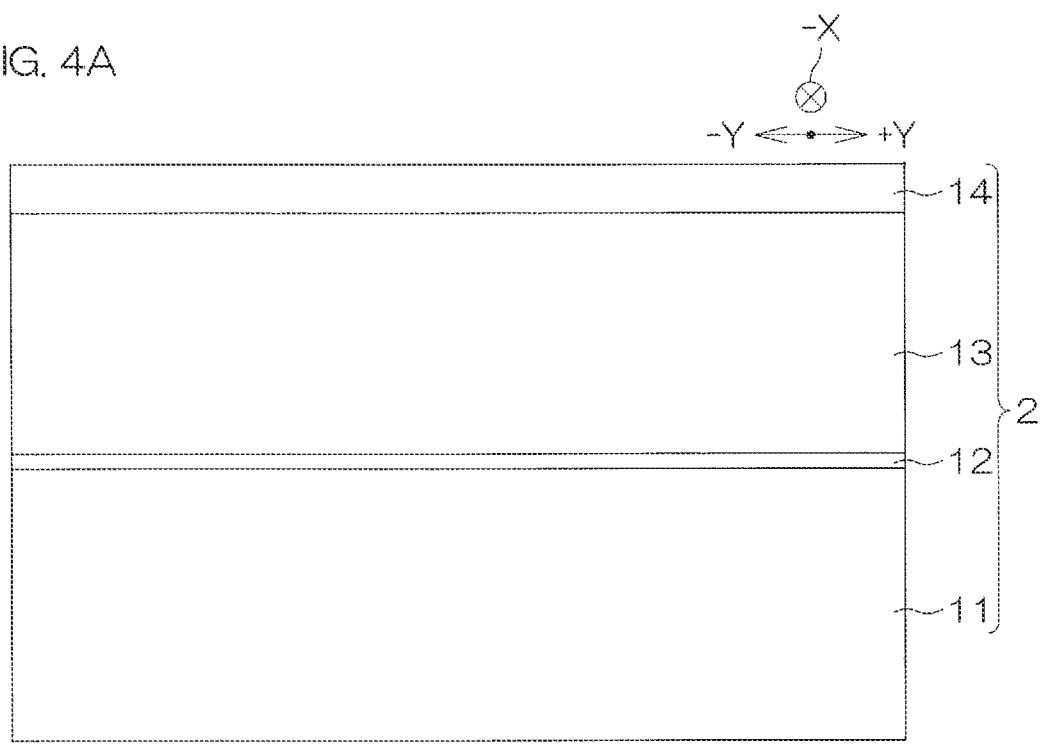
FIG. 4A is a sectional view of an example of a manufacturing process of the nitride semiconductor device of FIG. 1 and is a sectional view corresponding to the section plane of FIG. 2.
Figure 5A:
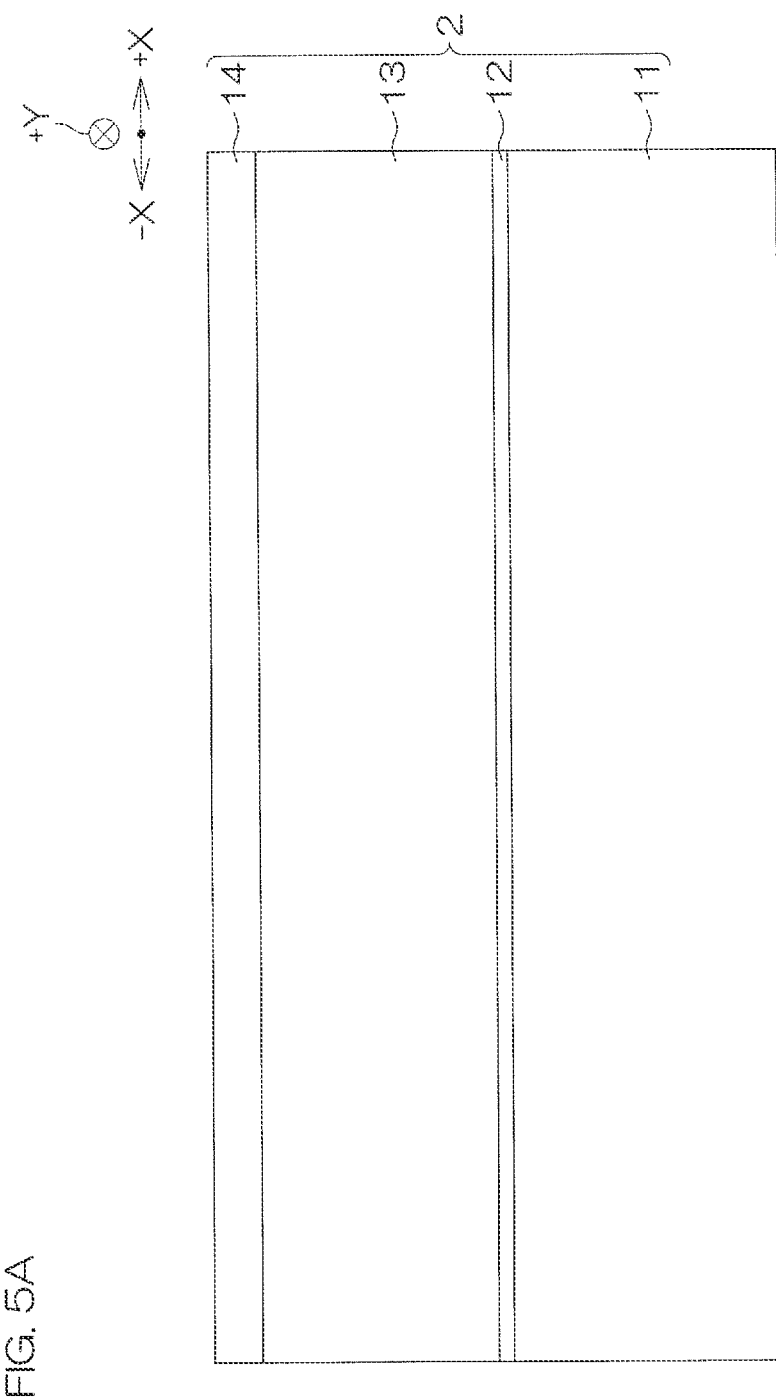
FIG. 5A is a sectional view of the example of the manufacturing process of the nitride semiconductor device of FIG. 1 and is a sectional view corresponding to the section plane of FIG. 3.

First, as shown in FIG. 4A and FIG. 5A, the buffer layer 12, the first nitride semiconductor layer 13, and the second nitride semiconductor layer 14 are epitaxially grown on the substrate 11 by an MOCVD (metal organic chemical vapor deposition) method. The semiconductor laminated structure 2 is thereby obtained.

Figure 4B:
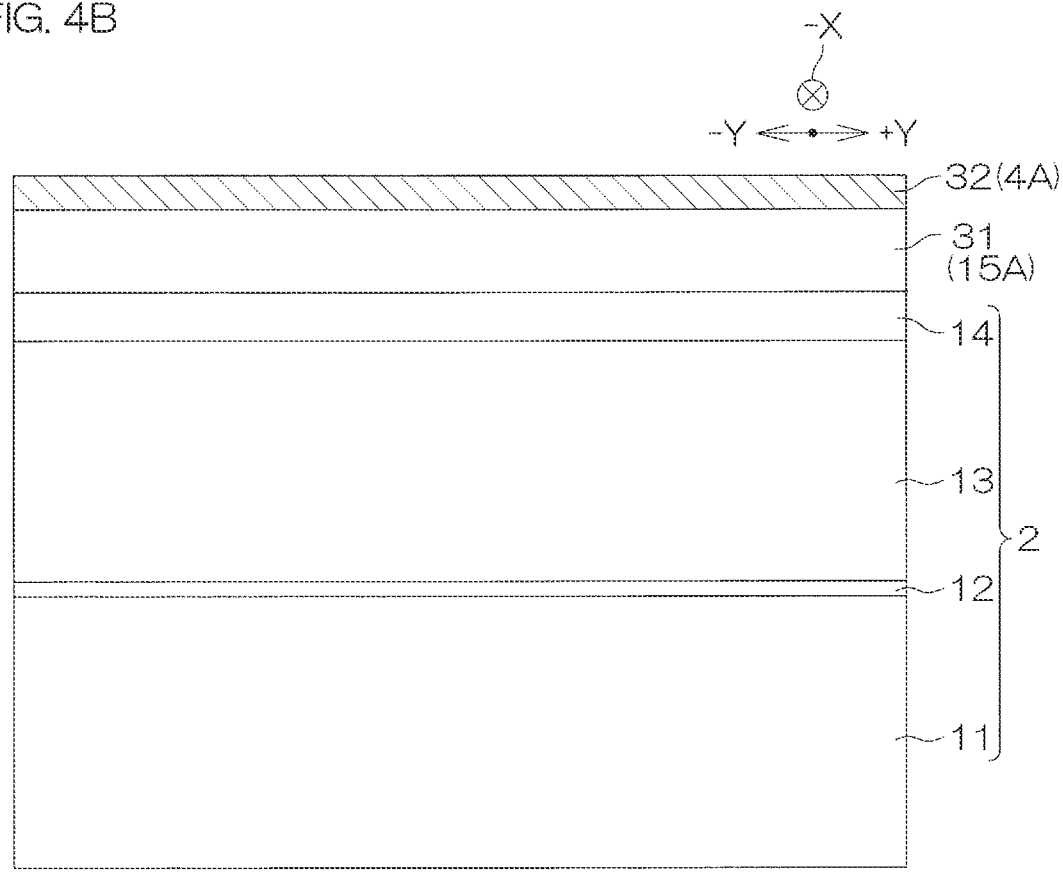
FIG. 4B is a sectional view of a step subsequent to that of FIG. 4A.

Next, as shown in FIG. 4B and FIG. 5B, a gate layer material film 31 that is a material film of the nitride semiconductor gate layers 15 is formed on the second nitride semiconductor layer 14 by the MOCVD method. Further, a gate electrode film 32 that is a material film of the gate electrode 4 is formed on the gate layer material film 31 by a sputtering method. In this preferred embodiment, the gate layer material film 31 is a p type GaN film and the gate electrode film 32 is a TiN film.

Figure 4C:
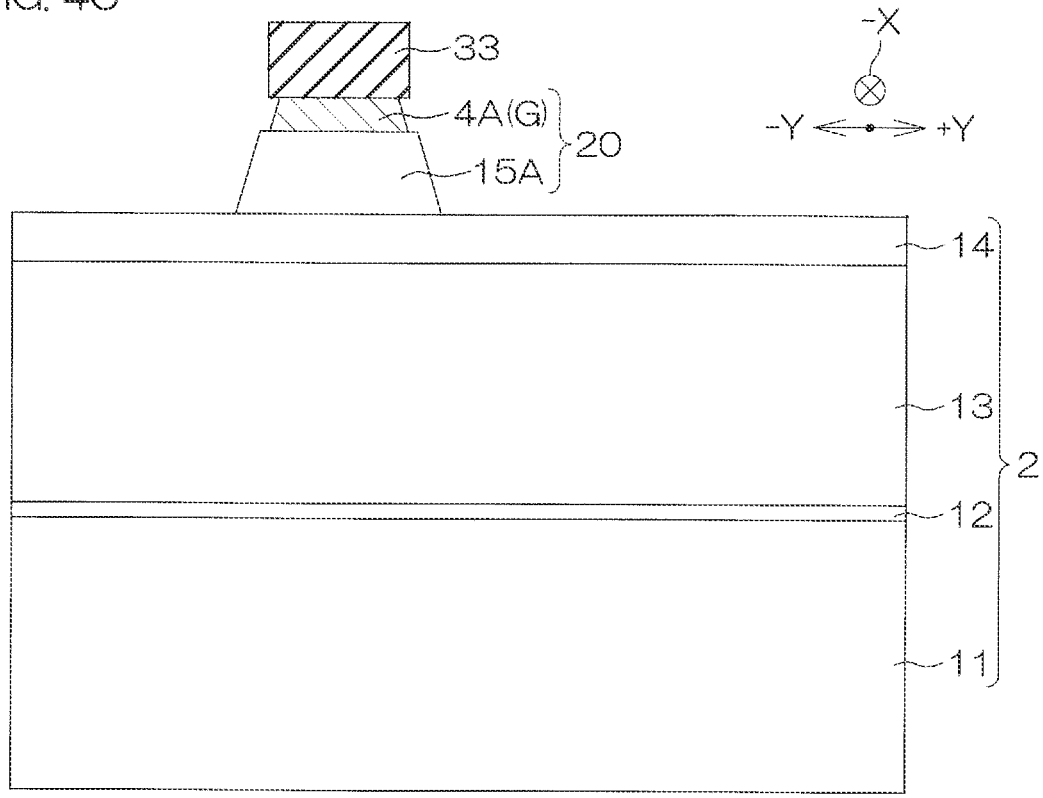
FIG. 4C is a sectional view of a step subsequent to that of FIG. 4B.

Next, as shown in FIG. 4C and FIG. 5C, a resist pattern 33 is formed on the gate electrode film 32 by photolithography such as to cover portions of the gate electrode film 32 that are to become the gate electrodes 4. The gate electrode film 32 and the gate layer material film 31 are then patterned by etching using the resist pattern 33 as a mask.

The gate electrodes 4 constituted of the gate electrode film 32 and the nitride semiconductor gate layers 15 constituted of the gate layer material film 31 are thereby obtained. The nitride semiconductor gate layers 15 are constituted of the ridge portions 15A and the ridge coupling portions 15B. The gate electrodes 4 are constituted of the gate principal electrode portions 4A that are formed on the ridge portions 15A and the base portions 4B that are formed on the ridge coupling portions 15B. The gate portions 20 that are constituted of the ridge portions 15A and the gate principal electrode portions 4A are thereby obtained. Thereafter, the resist pattern 33 is removed.

The patterning of the gate layer material film 31 is performed, for example, by just dry etching. The patterning of the gate layer material film 31 may be arranged to be performed by a first etching step by dry etching and a subsequent second etching step by wet etching. Also, structure fabrication may be performed by a step of forming side walls (for example, of $SiO_2$) on lateral walls of the gate layer material film 31, forming the ridge portions 15A by performing dry etching at a lateral width defined by the side wall lateral walls, and thereafter removing the side walls.

Figure 4D:
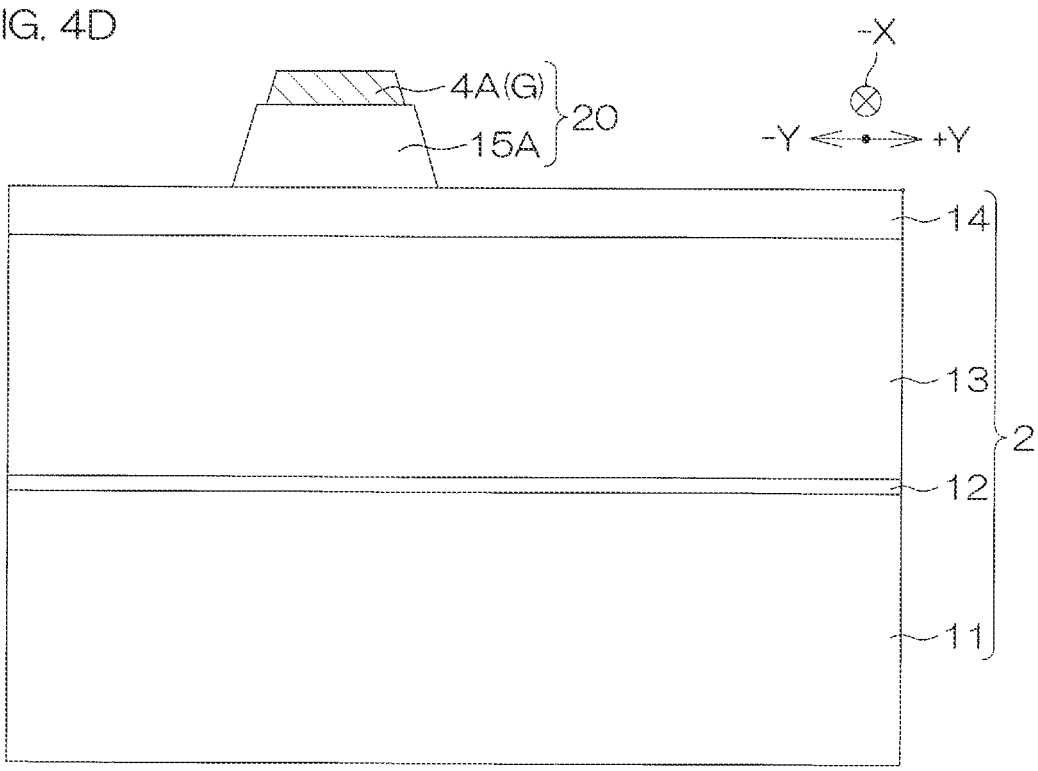
FIG. 4D is a sectional view of a step subsequent to that of FIG. 4C.
Figure 5D:
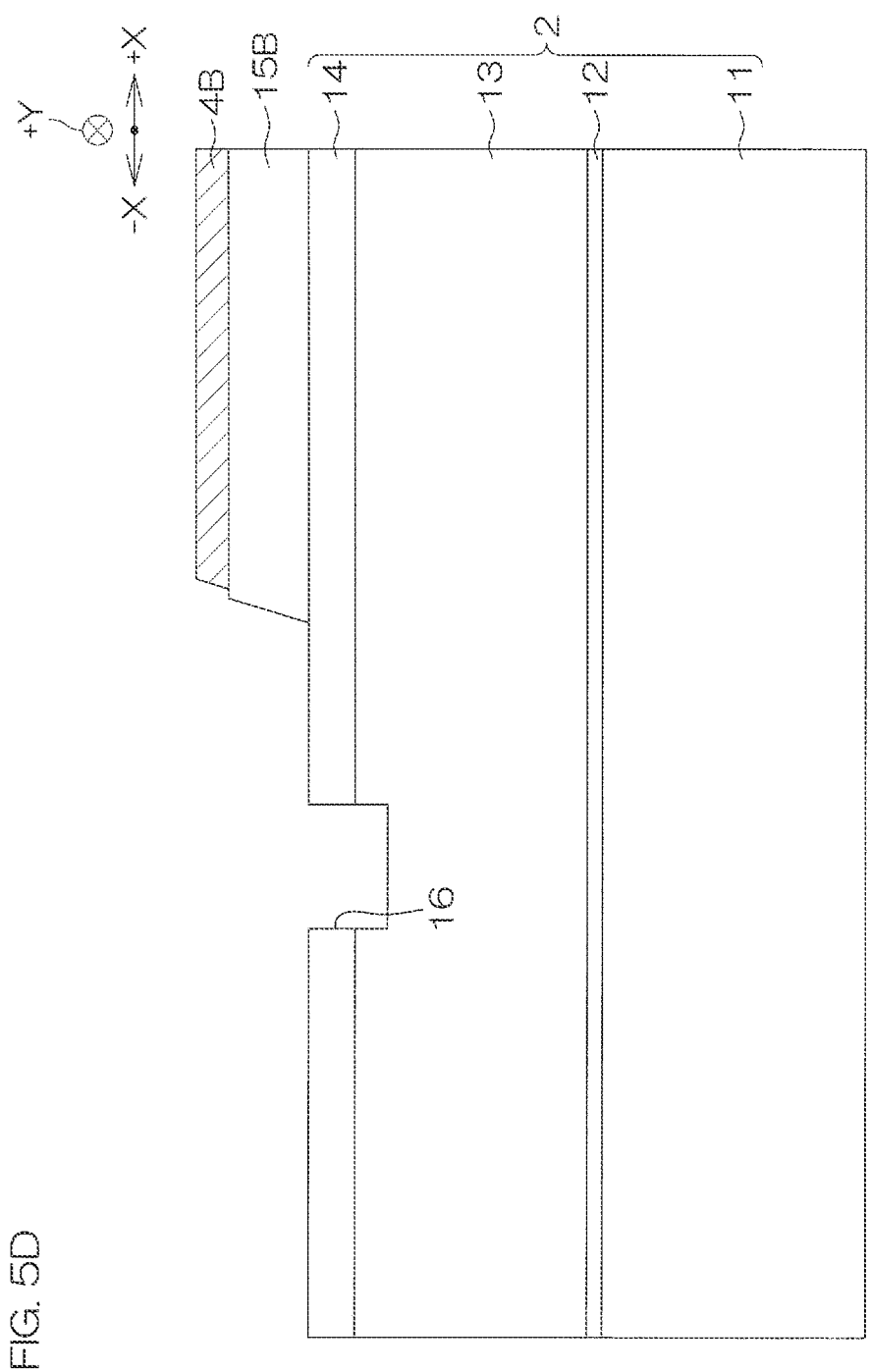
FIG. 5D is a sectional view of a step subsequent to that of FIG. 5C.

Next, as shown in FIG. 4D and FIG. 5D, the two-dimensional electron gas dividing grooves 16 are formed by photolithography and etching in the front surface of the second nitride semiconductor layer 14 at both end portions inside regions in which the nitride semiconductor gate layers 15 surround the source principal electrode portions 3A.

Figure 4E:
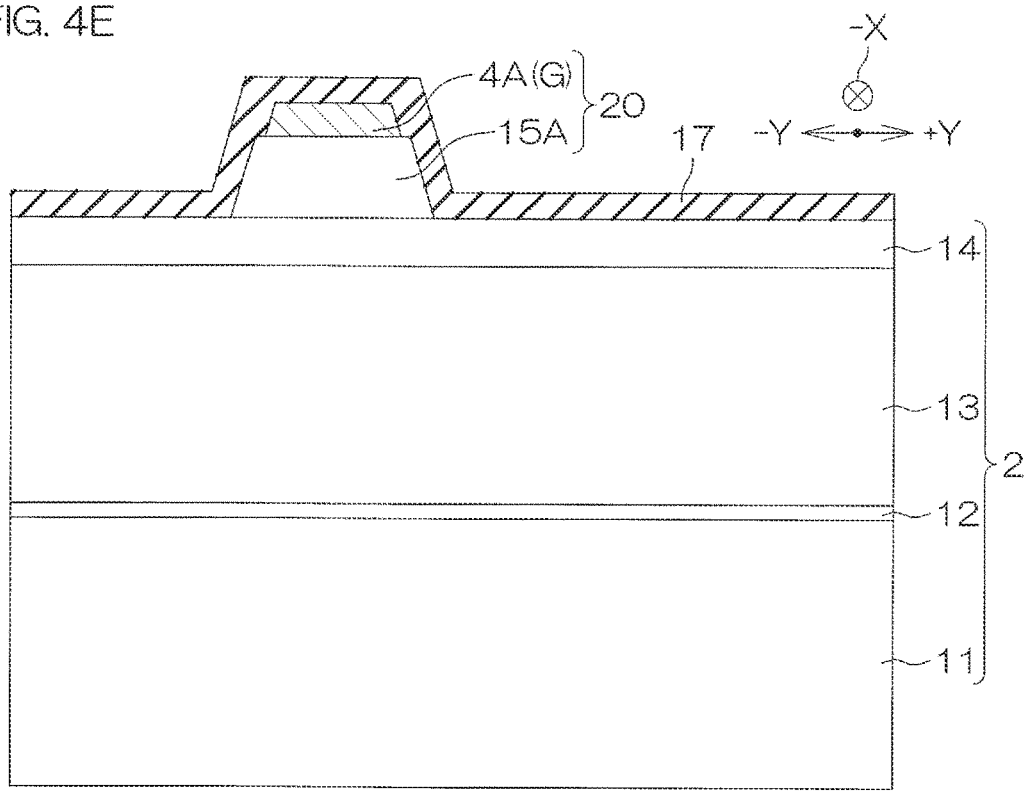
FIG. 4E is a sectional view of a step subsequent to that of FIG. 4D.

Next, as shown in FIG. 4E and FIG. 5E, the passivation film 17 is formed such as to cover entire front surfaces that are exposed. The passivation film 17 is constituted, for example, of SiN.

Figure 4F:
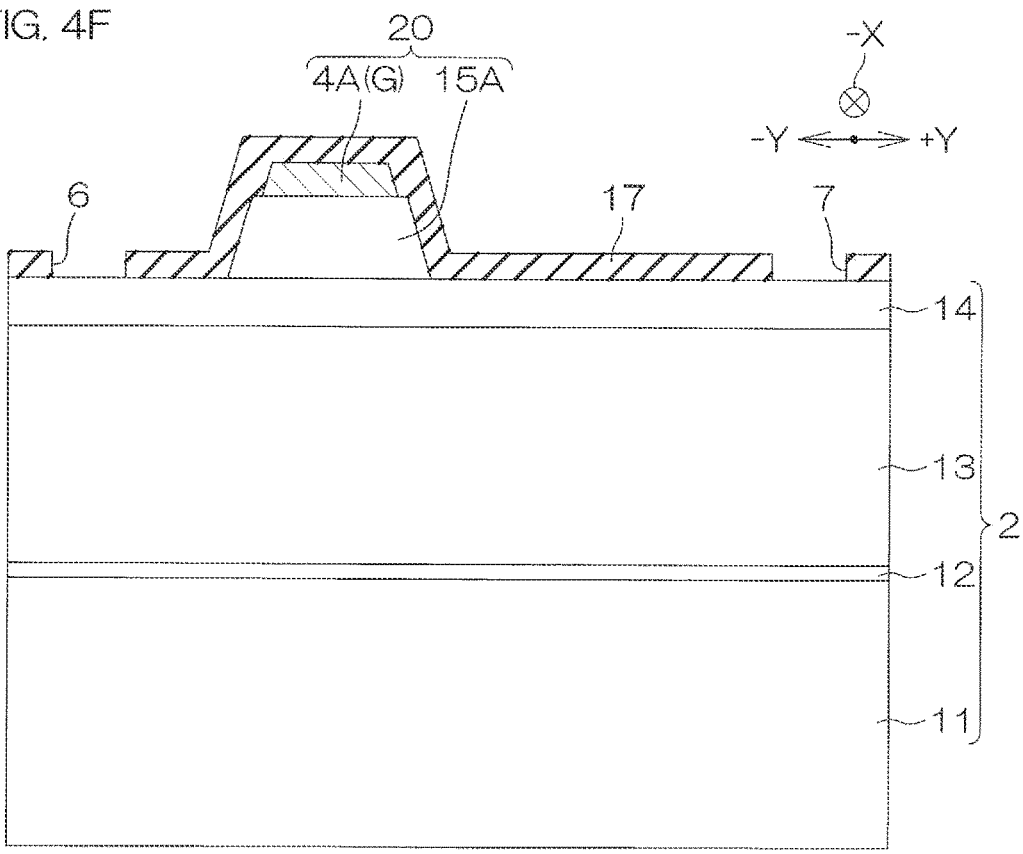
FIG. 4F is a sectional view of a step subsequent to that of FIG. 4E.
Figure 5F:
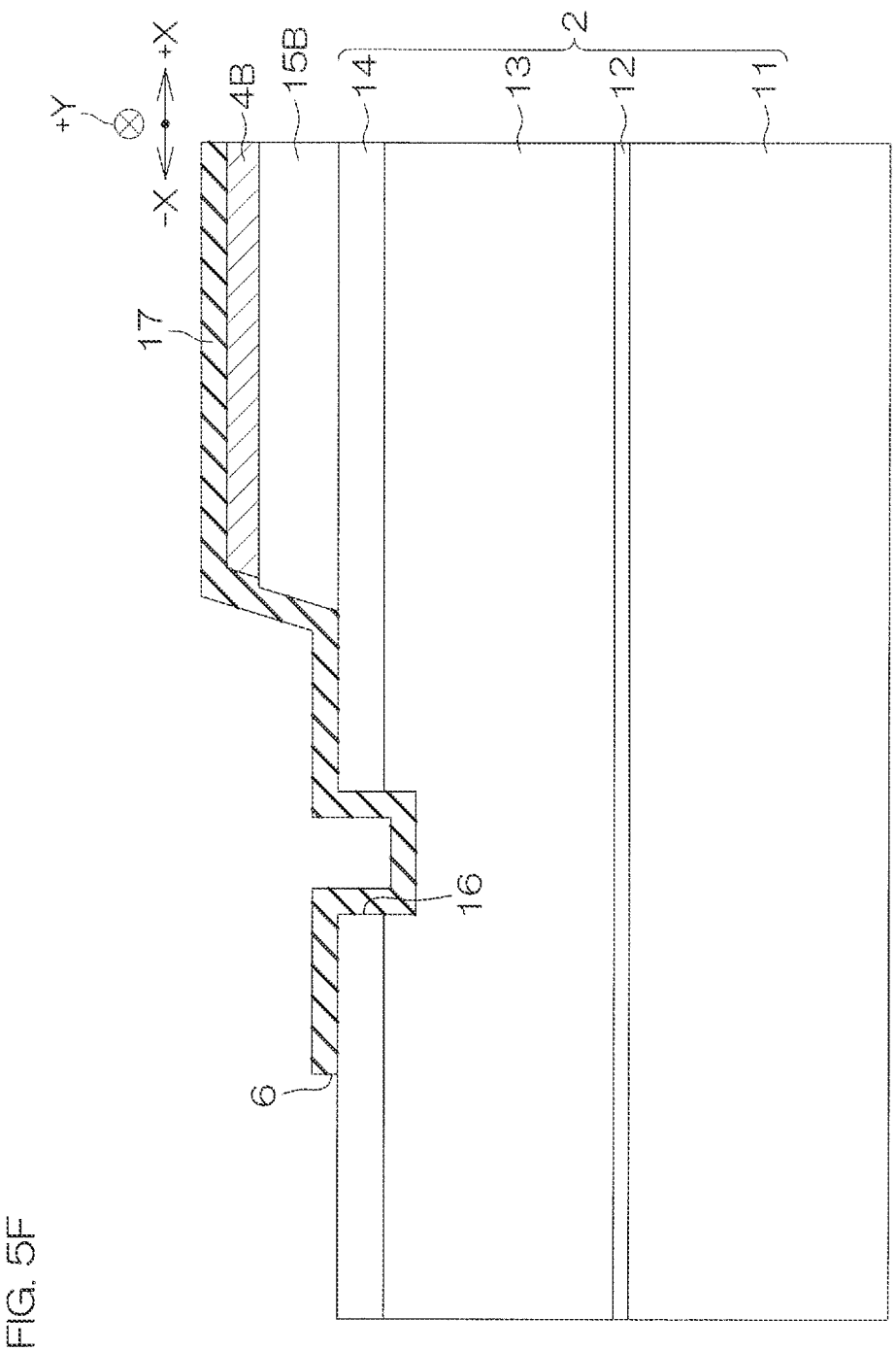
FIG. 5F is a sectional view of a step subsequent to that of FIG. 5E.

Next, as shown in FIGS. 4F and 5F, the source contact holes 6 and the drain contact holes 7 that reach the second nitride semiconductor layer 14 are formed in the passivation film 17.

Figure 4G:
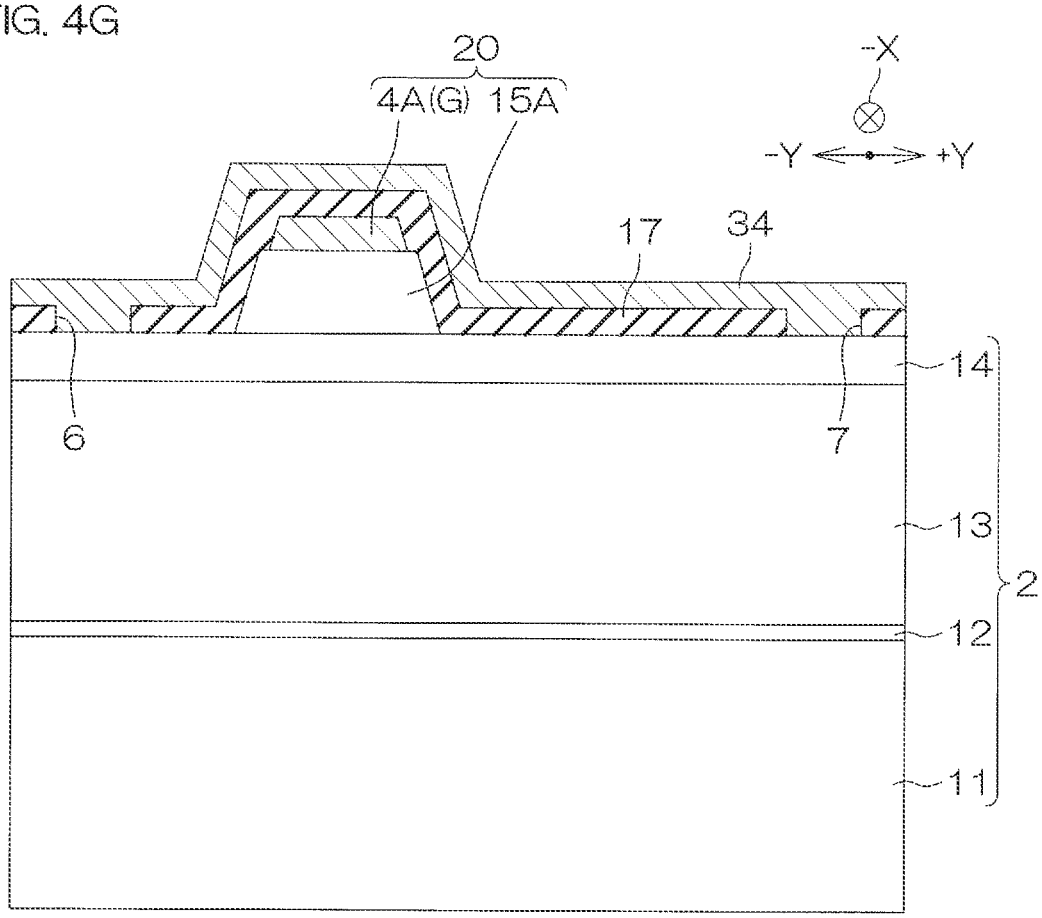
FIG. 4G is a sectional view of a step subsequent to that of FIG. 4F.
Figure 5G:
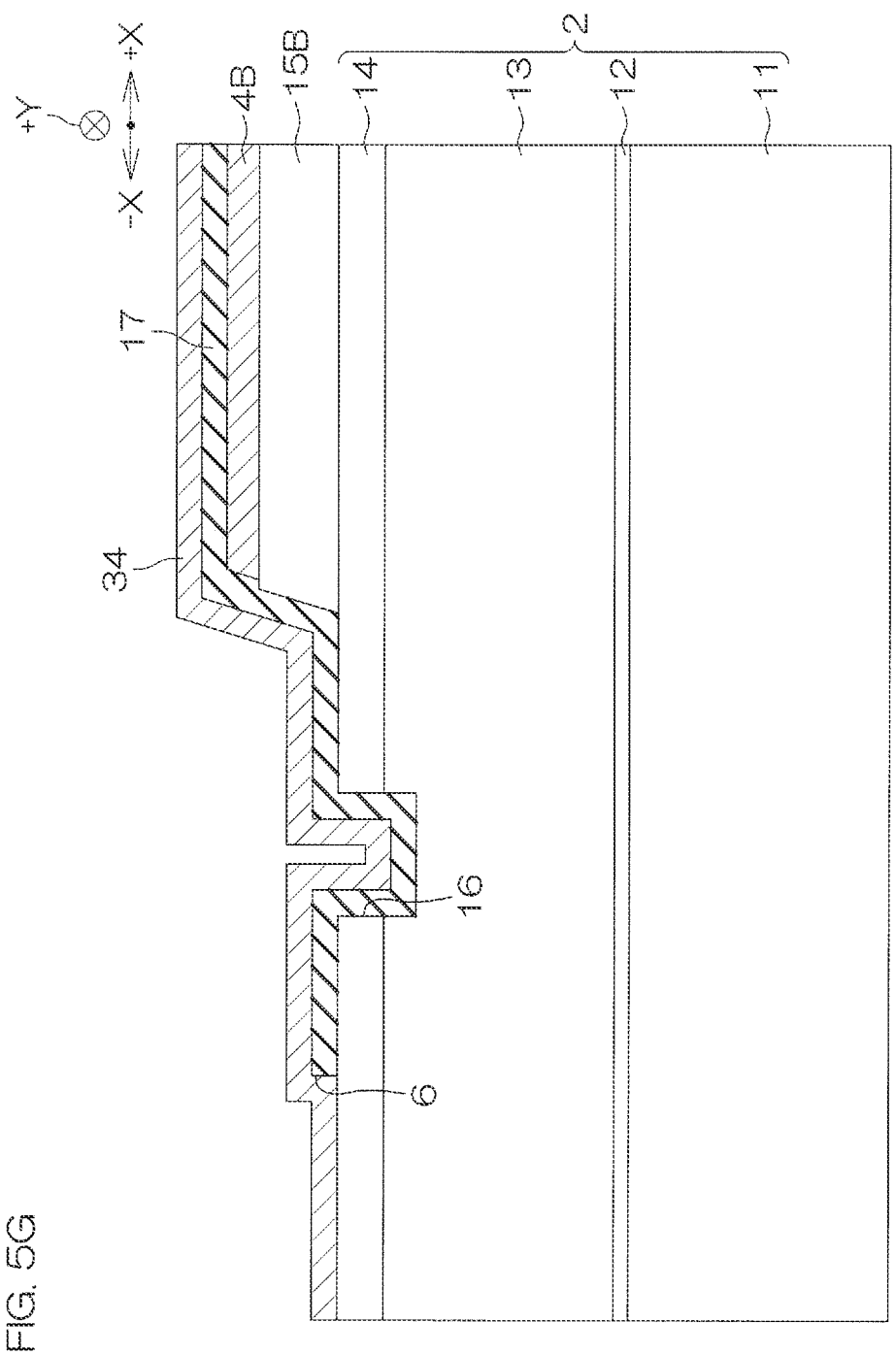
FIG. 5G is a sectional view of a step subsequent to that of FIG. 5F.

Next, as shown in FIG. 4G and FIG. 5G, a source/drain electrode film 34 is formed such as to cover entire front surfaces that are exposed.

Lastly, the source/drain electrode film 34 is patterned by photolithography and etching to form the source electrodes 3 and the drain electrodes 5 that are in ohmic contact with the second nitride semiconductor layer 14. The nitride semiconductor device 1 with the structure such as shown in FIG. 1 to FIG. 3 is thereby obtained.

With the nitride semiconductor device 1 according to the preferred embodiment described above, the length direction of the ridge portions 15A is the [110] direction of the semiconductor crystal structure that constitutes the second nitride semiconductor layer 14. On the other hand, a nitride semiconductor device that is the same in overall structure as the preferred embodiment described above but with which the length direction of the ridge portions 15A is the direction of the semiconductor crystal structure that constitutes the second nitride semiconductor layer 14 shall be deemed to be a comparative example.

If the X direction in FIG. 1 is the [110] direction of the semiconductor crystal structure that constitutes the second nitride semiconductor layer 14, the length direction of the ridge portions 15A, the source principal electrode portions 3A, the gate principal electrode portions 4A, and the drain principal electrode portions 5A in the comparative example is the Y direction in FIG. 1. Therefore, in the comparative example, the source principal electrode portions 3A (S), the gate principal electrode portions 4A (G), and the drain principal electrode portions 5A (D) are disposed cyclically in an order of DGSGDGS in the X direction.

Figure 6A:
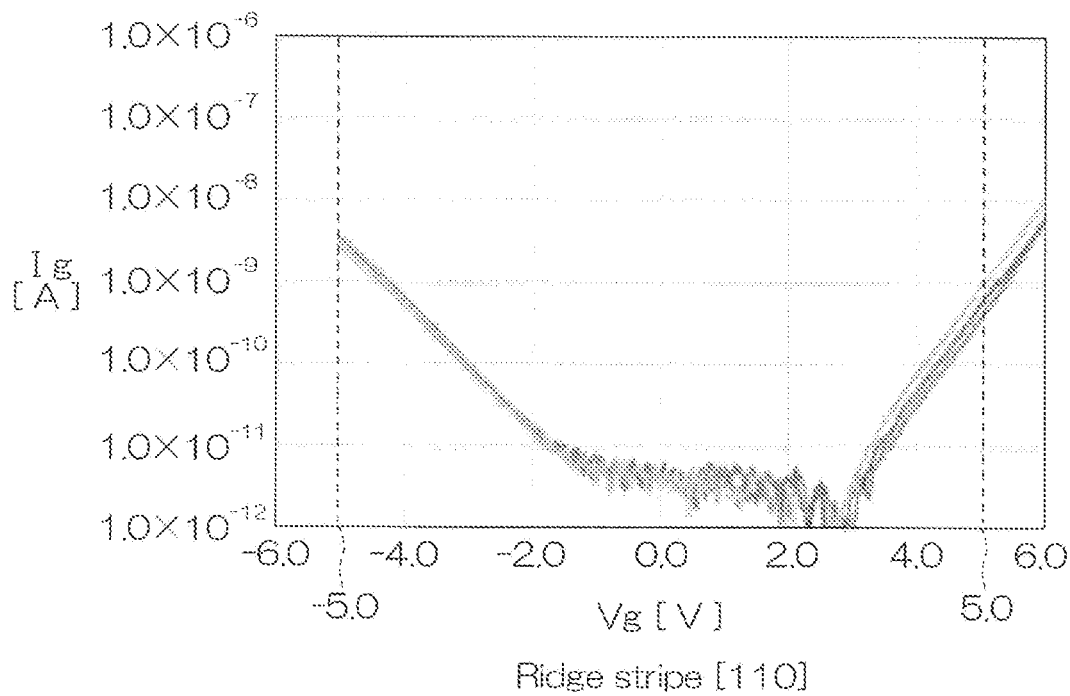
FIG. 6A is a graph of experiment results for the preferred embodiment and is a graph of the experiment results of gate-source leak current Ig [A] versus gate-source voltage Vg [V].
Figure 6B:
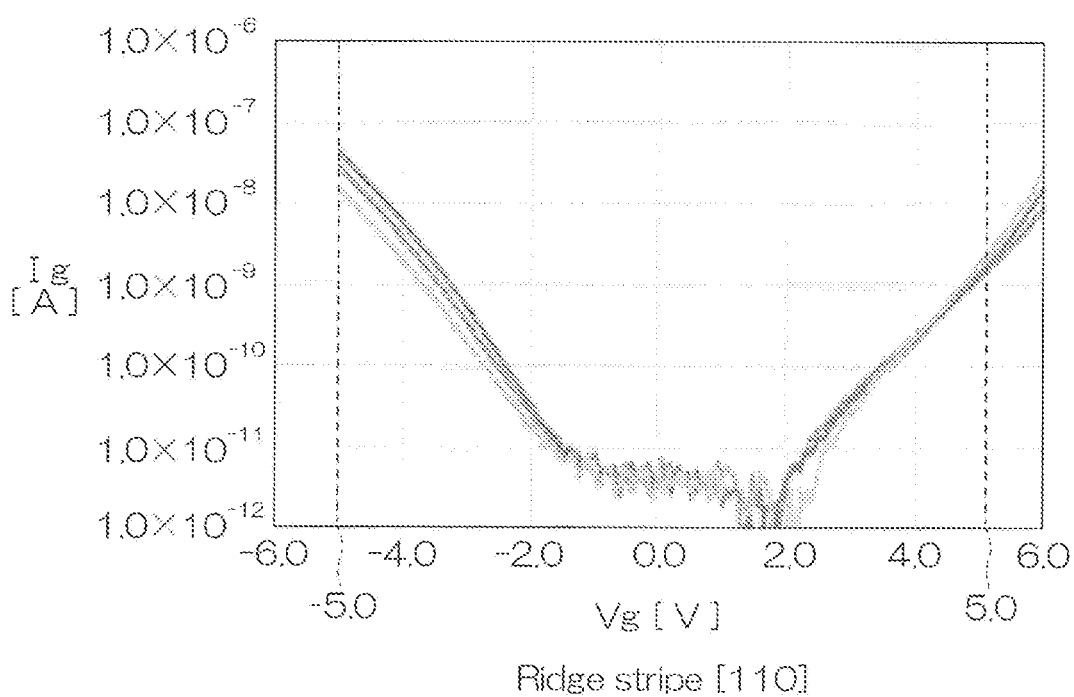
FIG. 6B is a graph of experiment results for a comparative example and is a graph of the experiment results of gate-source leak current Ig [A] versus gate-source voltage Vg [V].

FIG. 6A and FIG. 6B are graph of experiment results of gate-source leak current Ig [A] versus gate-source voltage Vg [V]. The graph of FIG. 6A shows experiment results for the preferred embodiment. The graph of FIG. 6B shows the experiment results for the comparative example.

Also, Table 1 shows the experiment results of the gate-source leak current Ig [nA] of the preferred embodiment and the comparative example when the gate-source voltage Vg is +5 V and −5 V.

TABLE 1

|  | Preferred embodiment | Comparative example |
| --- | --- | --- |
| Ig at Vg = +5 V | 4.2 nA | 11 nA |
| Ig at Vg = −5 V | 21 nA | 210 nA |

From FIG. 6A, FIG. 6B, and Table 1, it can be understood that in a range where the gate-source voltage is not less than approximately 4 [V] and in a range where the gate-source voltage is not more than approximately −4 [V], the preferred embodiment is reduced in the gate-source leak current (gate leak current) Ig in comparison to the comparative example.

The reason for this shall now be examined. From a standpoint of selective growth of a crystal, it is known that with Ga polar GaN, whereas a side surface of a selectively grown crystal becomes high in roughness when growth to a shape having the length direction in the [100] direction is performed, a comparatively flat side surface is obtained when growth to a shape having the length direction in the [110] direction is performed. This indicates that a side surface (inclined surface) of a ridge having the length direction in the [110] direction becomes a stable surface.

The ridge portions 15A of the preferred embodiment and the comparative example are not formed by selective growth of a crystal but are formed by etching (mainly, dry etching) the material film (p type GaN in the present preferred embodiment) of the nitride semiconductor gate layers 15. However, it can be presumed that as in the case of selective growth, surfaces of low roughness are more likely to be formed with the side surfaces of the ridge portions 15A having the length direction in the [110] direction in comparison with the side surfaces of the ridge portions 15A having the length direction in the [100] direction even when the ridge portions 15A are formed by etching.

When the surface roughness is high, a surface area of the side surfaces of the ridge portions 15A increases, leak paths from the gate electrodes 4 to the source electrodes 3 become numerous, and the gate leak current increases. It is considered that the gate leak current is decreased with the present preferred embodiment due to the surface roughness of the side surfaces of the ridge portions 15A being low in comparison to the comparative example.

With the preferred embodiment described above, the length direction of the ridge portions 15A is the [110] direction of the semiconductor crystal structure that constitutes the second nitride semiconductor layer 14 and therefore, the gate leak current can be reduced.

Also, with the preferred embodiment described above, the two-dimensional electron gas dividing grooves 16 are formed at both end portions inside the regions in which the nitride semiconductor gate layers 15 surround the source principal electrode portions 3A and therefore, a gate leak current that flows from the base portions 4B of the gate electrodes 4 to the source electrodes 3 via the two-dimensional electron gas can be reduced.

Here, although with the preferred embodiment described above, the side surfaces (inclined surfaces) of the ridge portions 15A are substantially (10-12) planes, the side surface of the ridge portions 15A do not have to be (10-12) planes. In this case, it is preferable for an inclination angle of the side surface of the ridge portions 15A to be not less than 80 degrees but less than 90 degrees with respect to the front surface of the second nitride semiconductor layer 14.

Figure 15:
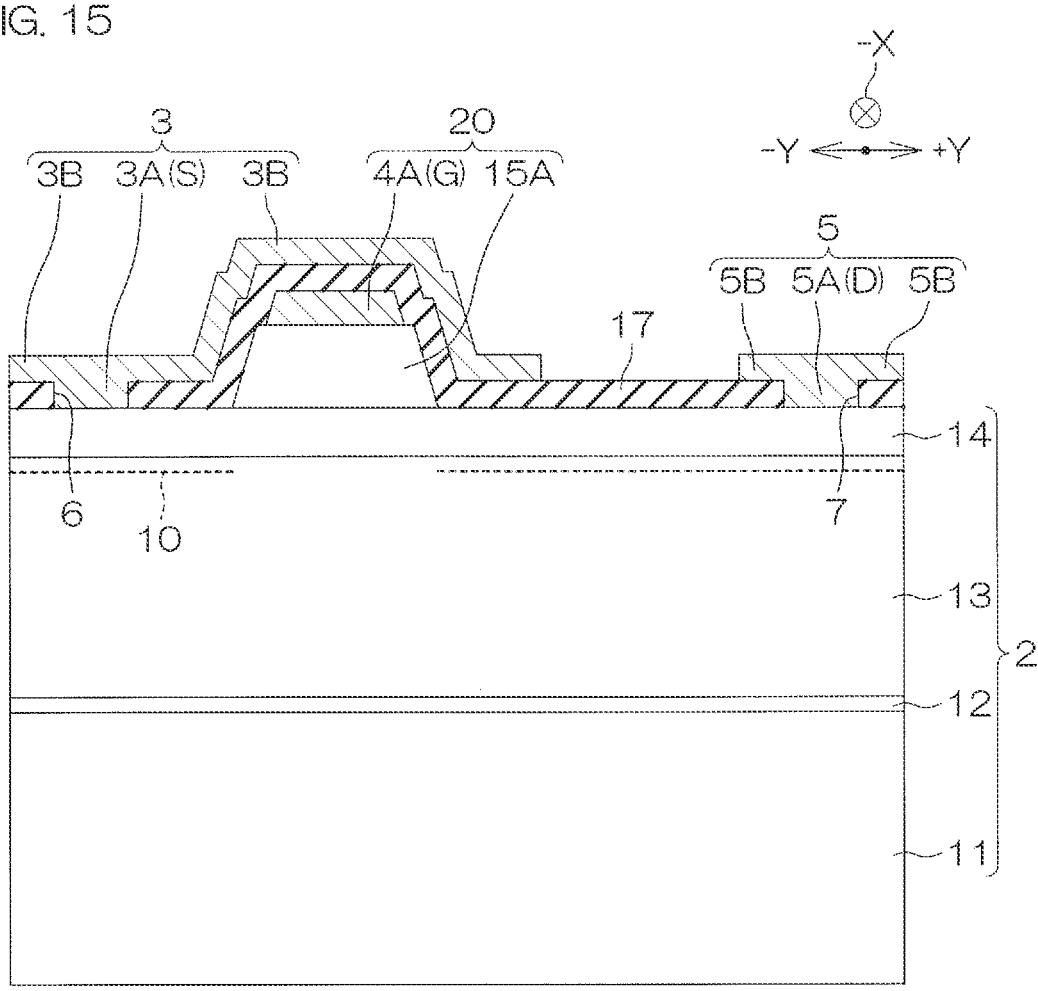
FIG. 15 is a sectional view of another example of cross-sectional shapes of a passivation film and a source electrode of FIG. 2.

Also, cross-sectional shapes of the passivation film 17 and the source electrodes 3 of FIG. 2 may instead be of shapes such as shown in FIG. 15.

Figure 8:
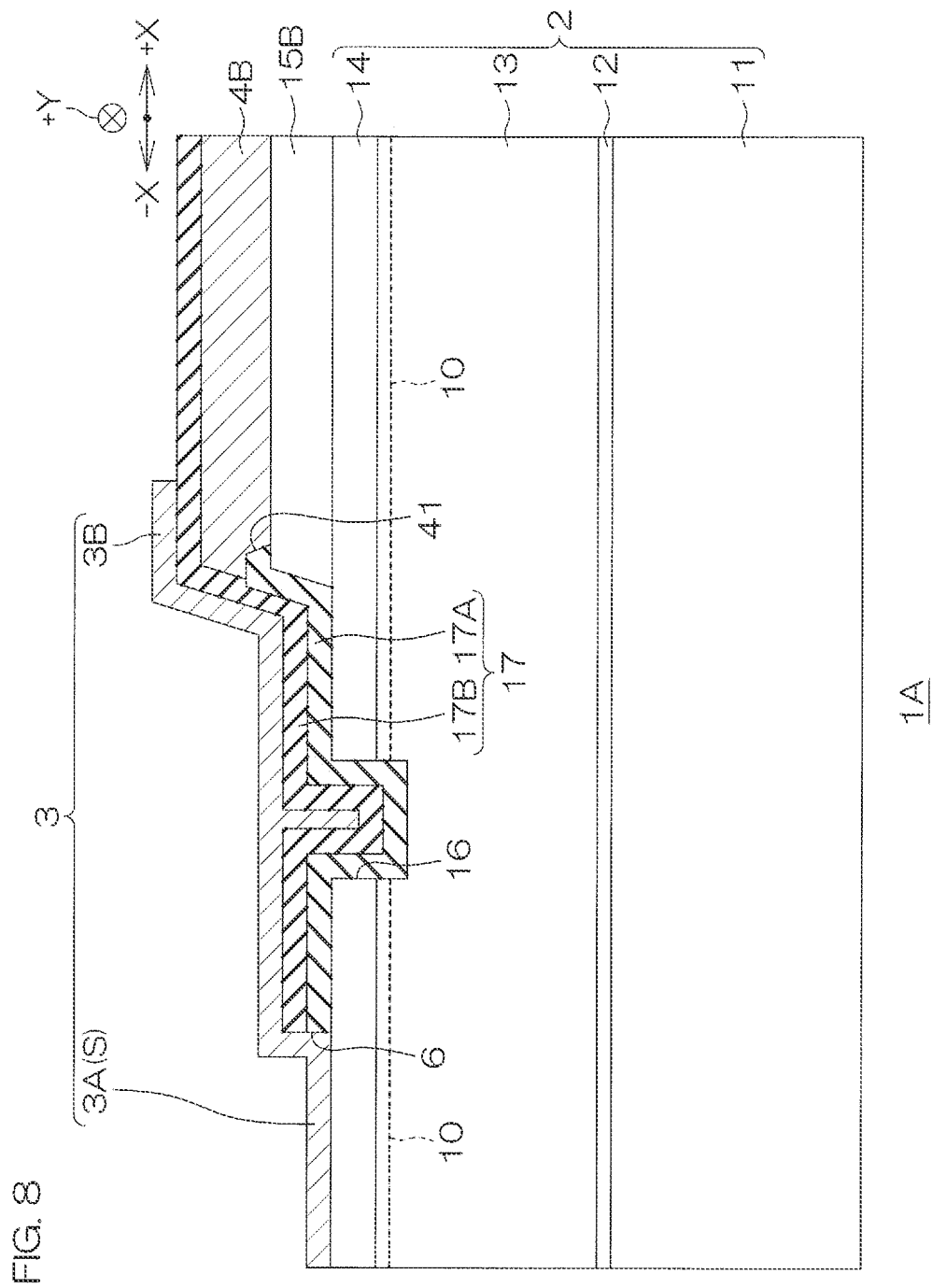
FIG. 8 is a sectional view for describing the arrangement of the nitride semiconductor device of FIG. 7 and is a sectional view corresponding to FIG. 3.

FIG. 7 is a sectional view for describing the arrangement of a nitride semiconductor device according to a second preferred embodiment of the present invention and is a sectional view corresponding to FIG. 2. FIG. 8 is a sectional view for describing the arrangement of the nitride semiconductor device of FIG. 7 and is a sectional view corresponding to FIG. 3.

In FIG. 7, portions corresponding to the respective portions of FIG. 2 described above are indicated with the same reference signs attached as in FIG. 2. In FIG. 8, portions corresponding to the respective portions of FIG. 3 described above are indicated with the same reference signs attached as in FIG. 3. Here, a plan view of a main portion of the nitride semiconductor device according to the second preferred embodiment is substantially the same as the plan view (FIG. 1) of the nitride semiconductor device 1 according to the first preferred embodiment.

The nitride semiconductor device 1A according to the second preferred embodiment differs from the nitride semiconductor device 1 according to the first preferred embodiment in the point that the passivation film 17 is constituted of a first insulating film 17A and a second insulating film 17B.

The first insulating film 17A is formed such as to cover the front surface of the second nitride semiconductor layer 14 (excluding portions in which the contact holes 6 and 7 are formed) and side surfaces and peripheral edge portions of upper surfaces of the nitride semiconductor gate layers 15 (ridge portions 15A and ridge coupling portions 15B). In other words, opening portions 41 that expose regions surrounded by the peripheral edge portions of the upper surfaces of the nitride semiconductor gate layers 15 are formed in the first insulating film 17A. In this preferred embodiment, the first insulating film 17A is constituted of an SiN film. The first insulating film 17A may instead be constituted of an SiO$_2$ film.

The gate electrodes 4 (gate principal electrode portions 4A and base portions 4B) are formed such as to cover the first insulating film 17A on the upper surface peripheral edge portions of the nitride semiconductor gate layers 15 and exposed surfaces of the upper surfaces of the nitride semiconductor gate layers 15.

The second insulating film 17B is formed such as to cover a front surface of the first insulating film 17A (excluding portions in which the contact holes 6 and 7 are formed and portions covered by the gate electrodes 4) and side surfaces and upper surfaces of the gate electrodes 4. In this preferred embodiment, the second insulating film 17B is constituted of an SiN film. The second insulating film 17B may instead be constituted of an SiO$_2$ film.

The contact holes 6 and the drain contact holes 7 that penetrate through the first insulating film 17A and the second insulating film 17B are formed therein. The source electrodes 3 penetrate through the source contact holes 6 to be in ohmic contact with the second nitride semiconductor layer 14. The drain electrodes 5 penetrate through the drain contact holes 7 to be in ohmic contact with the second nitride semiconductor layer 14.

Even in the nitride semiconductor device 1A according to the second preferred embodiment, the length direction of the ridge portions 15A is the [110] direction of the semiconductor crystal structure that constitutes the second nitride semiconductor layer 14.

With the nitride semiconductor device 1A according to the second preferred embodiment, the nitride semiconductor gate layers 15 are formed by forming a gate layer material film that is a material film of the nitride semiconductor gate layers 15 on the second nitride semiconductor layer 14 and thereafter patterning the gate layer material film.

Next, the first insulating film 17A is formed such as to cover entire front surfaces that are exposed. The opening portions 41 are then formed in the first insulating film 17A on the nitride semiconductor gate layers 15 such as to expose the regions surrounded by the peripheral edge portions of the upper surfaces of the nitride semiconductor gate layers 15.

Next, a gate electrode film that is a material film of the gate electrodes 4 is formed such as to cover entire front surfaces that are exposed. The gate electrodes 4 are then formed by patterning the gate electrode film.

Next, the second insulating film 17B is formed such as to cover entire front surfaces that are exposed. The source contact holes 6 and the drain contact holes 7 that penetrate through the first insulating film 17A and the second insulating film 17B are then formed therein.

Lastly, a source/drain electrode film is formed such as to cover entire front surfaces that are exposed. The source electrodes 3 and the drain electrodes 5 that are in ohmic contact with the second nitride semiconductor layer 14 are then formed by patterning the source/drain electrode film.

Figure 9:
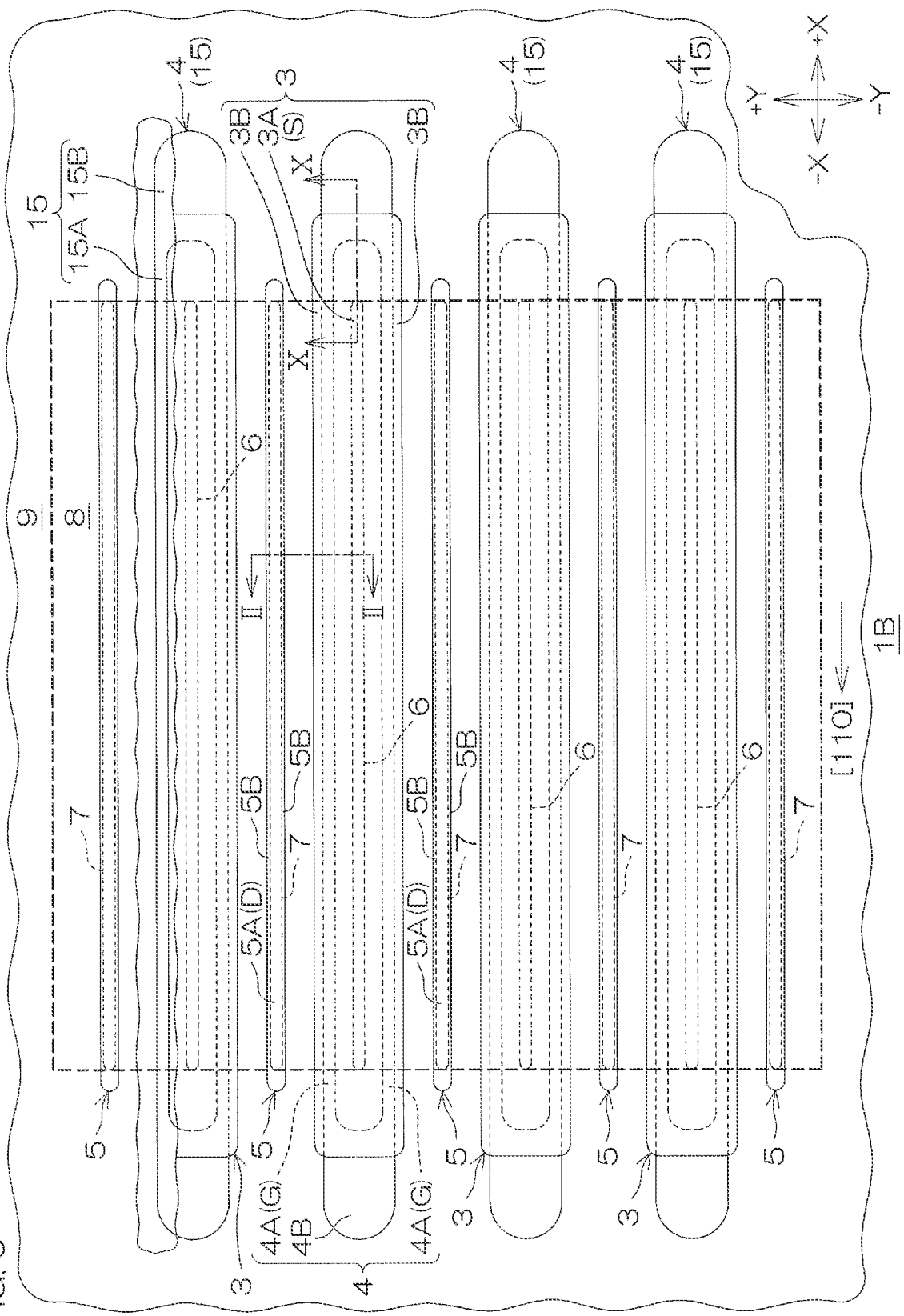
FIG. 9 is a partial plan view for describing the arrangement of a nitride semiconductor device according to a third preferred embodiment of the present invention.
Figure 10:
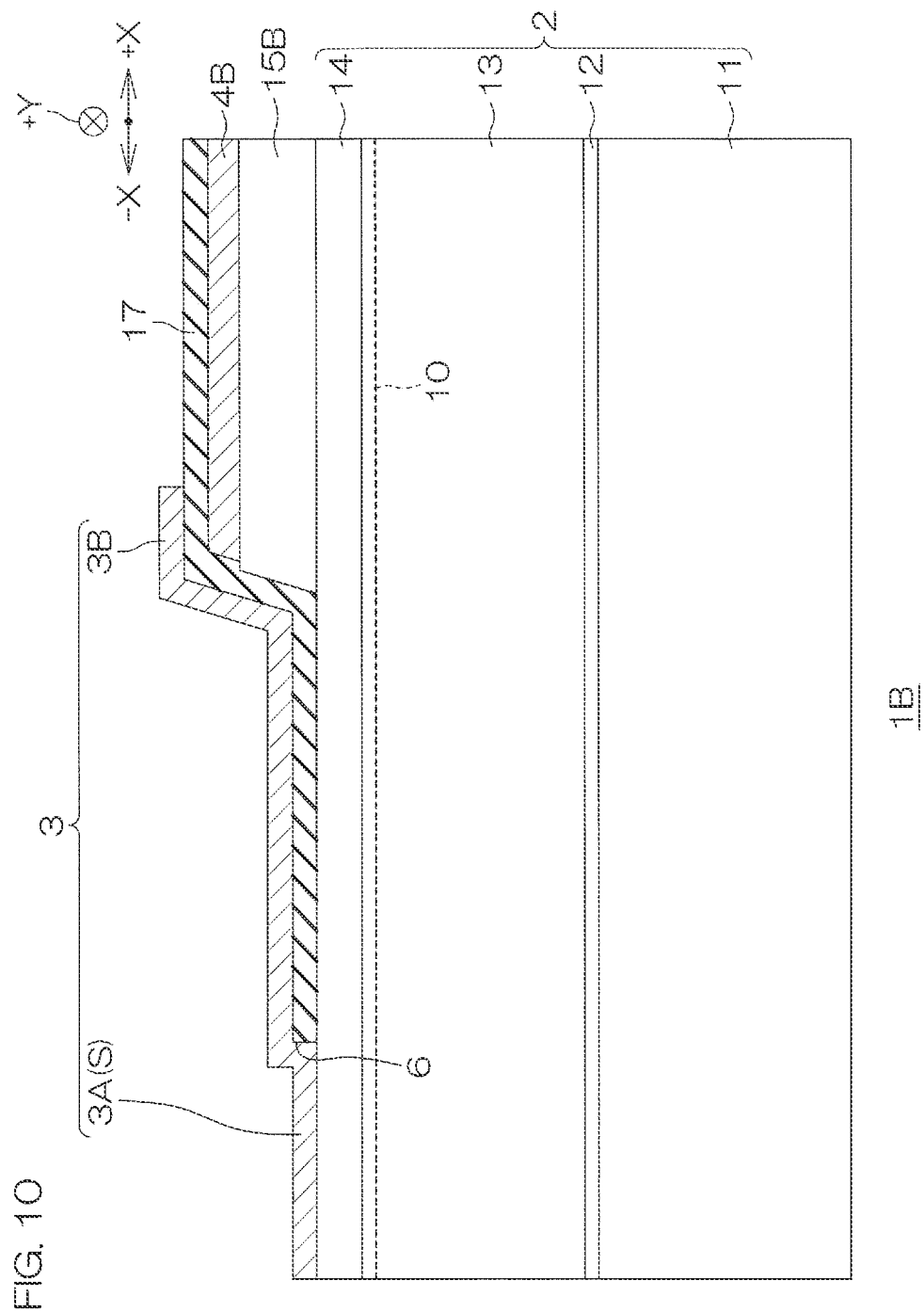
FIG. 10 is an enlarged sectional view taken along line X-X of FIG. 9.

FIG. 9 is a partial plan view for describing the arrangement of a nitride semiconductor device according to a third preferred embodiment of the present invention. FIG. 10 is an enlarged sectional view taken along line X-X of FIG. 9. In FIG. 9, portions corresponding to the respective portions of FIG. 1 described above are indicated with the same reference signs attached as in FIG. 1. In FIG. 10, portions corresponding to the respective portions of FIG. 3 described above are indicated with the same reference signs attached as in FIG. 3. A cross section along the line II-II in FIG. 9 is the same as that of the sectional view of FIG. 2 described above.

The nitride semiconductor device 1B according to the third preferred embodiment differs from the nitride semiconductor device 1 according to the first preferred embodiment in just the point that the two-dimensional electron gas dividing grooves 16 are not formed. Even in the nitride semiconductor device 1B according to the third preferred embodiment, the length direction of the ridge portions 15A is the [110] direction of the semiconductor crystal structure that constitutes the second nitride semiconductor layer 14.

Figure 11:
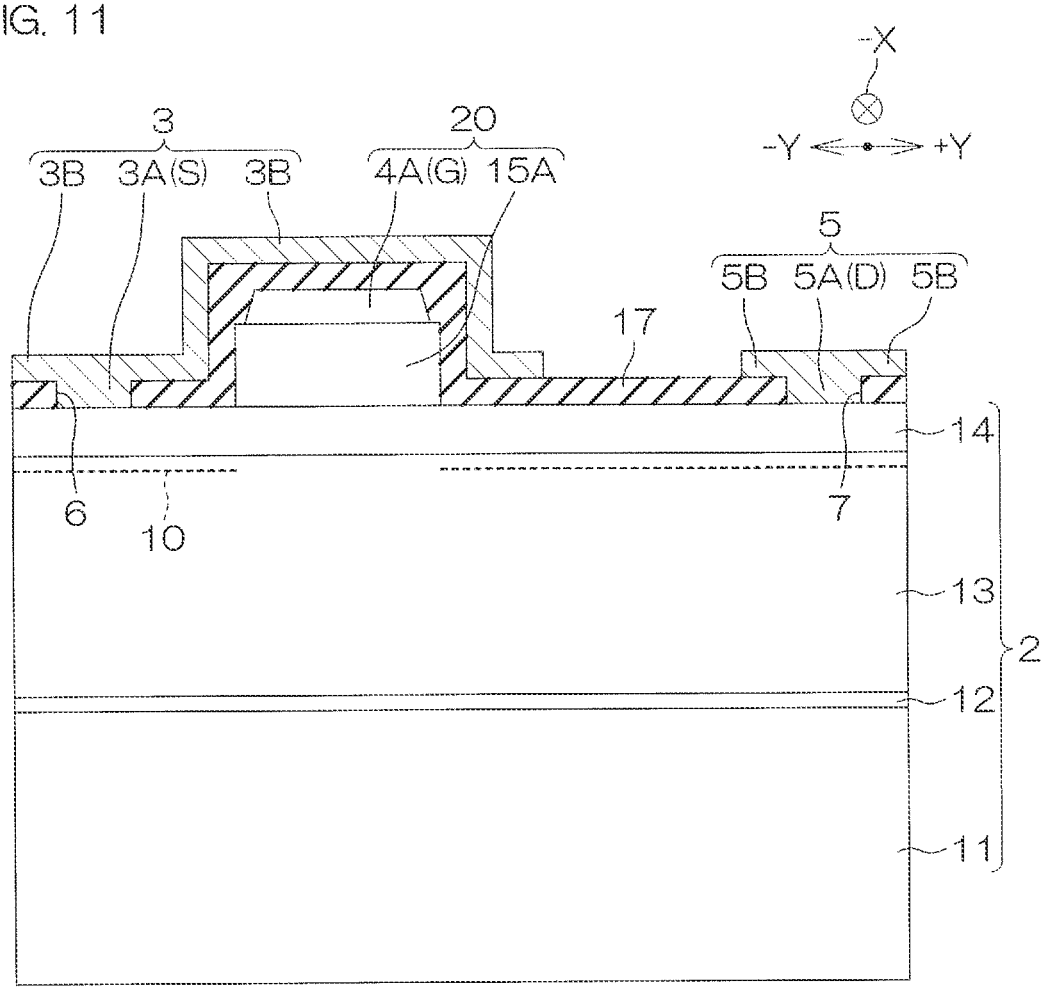
FIG. 11 is a sectional view for describing the arrangement of a nitride semiconductor device according to a fourth preferred embodiment of the present invention and is a sectional view corresponding to FIG. 2.
Figure 12:
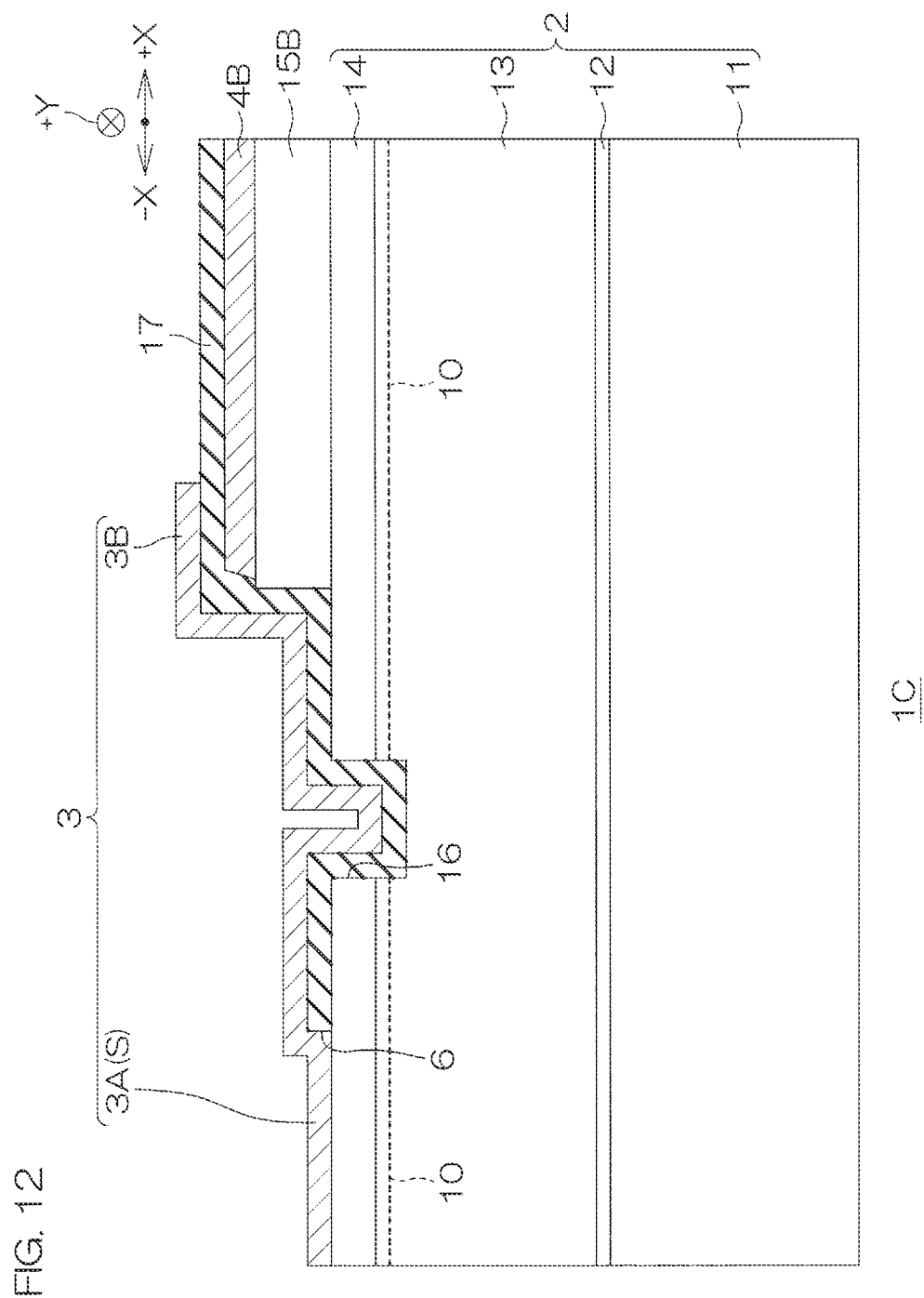
FIG. 12 is a sectional view for describing the arrangement of the nitride semiconductor device of FIG. 11 and is a sectional view corresponding to FIG. 3.

FIG. 11 is a sectional view for describing the arrangement of a nitride semiconductor device according to a fourth preferred embodiment of the present invention and is a sectional view corresponding to FIG. 2. FIG. 12 is a sectional view for describing the arrangement of the nitride semiconductor device of FIG. 11 and is a sectional view corresponding to FIG. 3.

In FIG. 11, portions corresponding to the respective portions of FIG. 2 described above are indicated with the same reference signs attached as in FIG. 2. In FIG. 12, portions corresponding to the respective portions of FIG. 3 described above are indicated with the same reference signs attached as in FIG. 3. Here, a plan view of a main portion of the nitride semiconductor device 10 according to the fourth preferred embodiment is substantially the same as the plan view (FIG. 1) of the nitride semiconductor device 1 according to the first preferred embodiment.

The nitride semiconductor device 10 according to the fourth preferred embodiment differs from the nitride semiconductor device 1 according to the first preferred embodiment in just the point that the side surfaces of the ridge portions 15A (see FIG. 11) and the side surfaces of the ridge coupling portions 15B (see FIG. 12) are formed to be perpendicular (90 degrees) to the front surface of the second nitride semiconductor layer 14. Even in the nitride semiconductor device 10 according to the fourth preferred embodiment, the length direction of the ridge portions 15A is the [110] direction of the semiconductor crystal structure that constitutes the second nitride semiconductor layer 14.

Although with the nitride semiconductor device 10 according to the fourth preferred embodiment, the two-dimensional electron gas dividing grooves 16 are formed as in the nitride semiconductor device 1 according to the first preferred embodiment, the two-dimensional electron gas dividing grooves 16 do not have to be formed.

Figure 13:
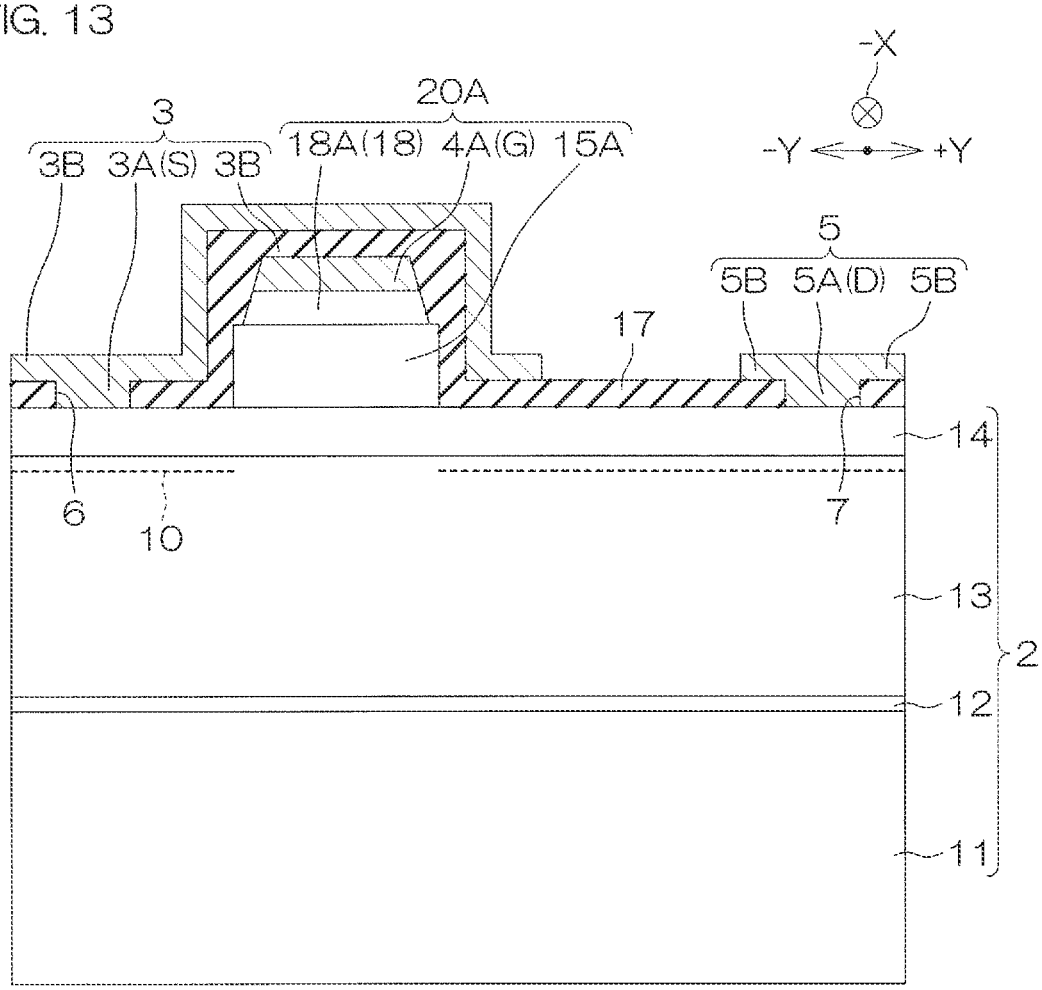
FIG. 13 is a sectional view for describing the arrangement of a nitride semiconductor device according to a fifth preferred embodiment of the present invention and is a sectional view corresponding to FIG. 2.
Figure 14:
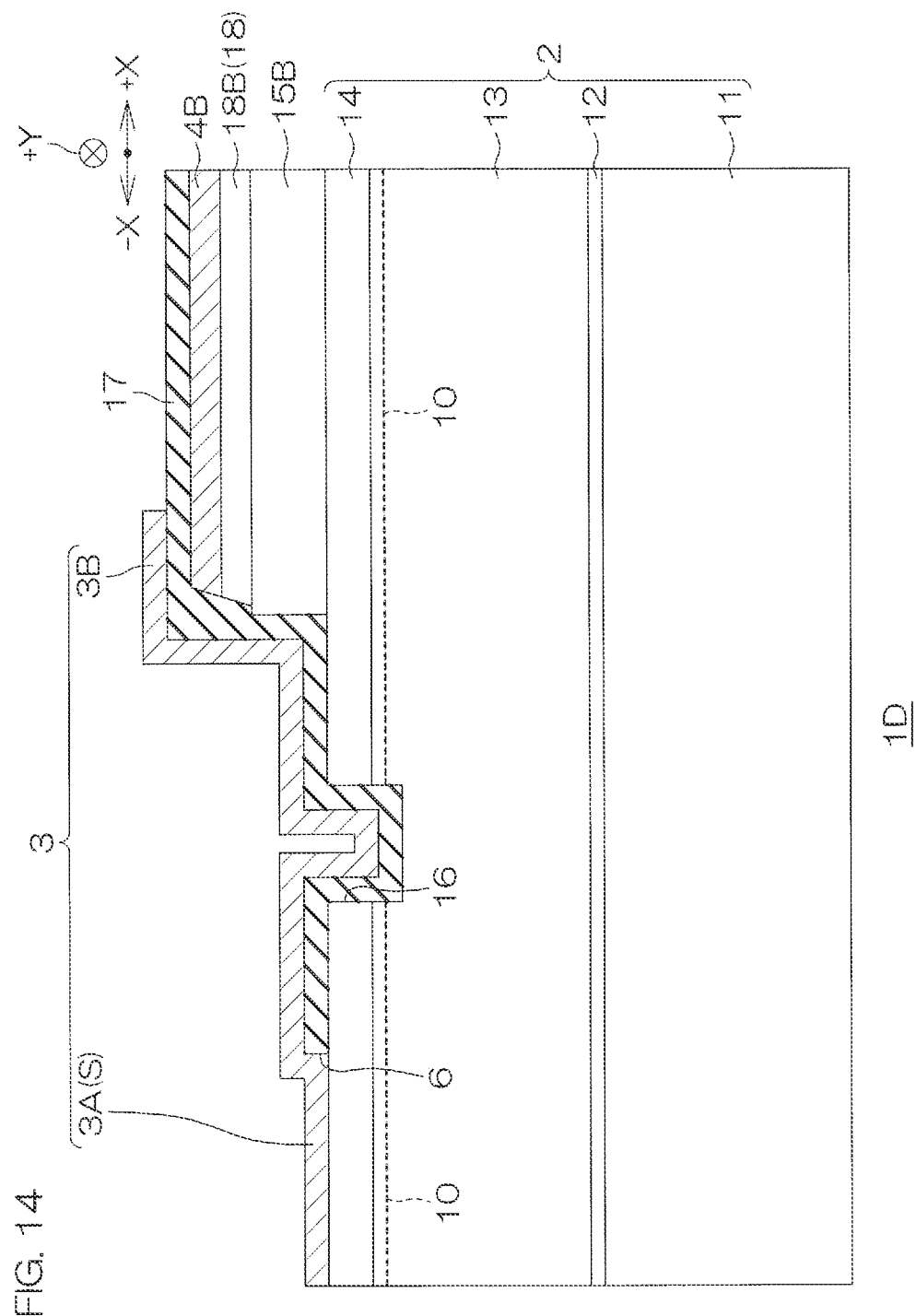
FIG. 14 is a sectional view for describing the arrangement of the nitride semiconductor device of FIG. 13 and is a sectional view corresponding to FIG. 3.

FIG. 13 is a sectional view for describing the arrangement of a nitride semiconductor device according to a fifth preferred embodiment of the present invention and is a sectional view corresponding to FIG. 2. FIG. 14 is a sectional view for describing the arrangement of the nitride semiconductor device of FIG. 13 and is a sectional view corresponding to FIG. 3.

In FIG. 13, portions corresponding to the respective portions of FIG. 2 described above are indicated with the same reference signs attached as in FIG. 2. In FIG. 14, portions corresponding to the respective portions of FIG. 3 described above are indicated with the same reference signs attached as in FIG. 3. Here, a plan view of a main portion of the nitride semiconductor device 1D according to the fifth preferred embodiment is substantially the same as the plan view (FIG. 1) of the nitride semiconductor device 1 according to the first preferred embodiment.

The nitride semiconductor device 1D according to the fifth preferred embodiment differs from the nitride semiconductor device 1 according to the first preferred embodiment in the point that the side surfaces of the ridge portions 15A (see FIG. 13) and the side surfaces of the ridge coupling portions 15B (see FIG. 14) are formed to be perpendicular (90 degrees) to the front surface of the second nitride semiconductor layer 14.

Further, the nitride semiconductor device 1D according to the fifth preferred embodiment differs from the nitride semiconductor device 1 according to the first preferred embodiment in the point that gate insulating films 18 are interposed between the nitride semiconductor gate layers 15 and the gate electrodes 4. Each gate insulating film 18 is constituted of a pair of principal insulating film portions 18A that are formed on the pair of ridge portions 15A of each nitride semiconductor gate layer 15 and principal insulating film coupling portions 18B that are formed on the ridge coupling portions 15B of the nitride semiconductor gate layer 15. Therefore, with the nitride semiconductor device 1D according to the fifth preferred embodiment, a gate portion 20A is constituted of each ridge portion 15A, the principal insulating film portion 18A formed thereon, and the gate principal electrode portion 4A formed thereon.

In this preferred embodiment, the gate insulating film 18 is constituted of SiN. A thickness of the gate insulating film 18 is approximately 10 nm to 50 nm. Besides SiN, the gate insulating film 18 may be constituted of $SiO_2$, SiON, $Al_2O_3$, AlN, AlON, HfO, HfN, HfON, HfSiON, AlON, etc.

Even in the nitride semiconductor device 1D according to the fifth preferred embodiment, the length direction of the ridge portions 15A is the [110] direction of the semiconductor crystal structure that constitutes the second nitride semiconductor layer 14.

With this arrangement, the gate leak current can be reduced further because the gate insulating films 18 are interposed between the nitride semiconductor gate layers 15 and the gate electrodes 4.

Although with the nitride semiconductor device 1D according to the fifth preferred embodiment, the two-dimensional electron gas dividing grooves 16 are formed as in the nitride semiconductor device 1 according to the first preferred embodiment, the two-dimensional electron gas dividing grooves 16 do not have to be formed.

Also, although with the nitride semiconductor device 1D according to the fifth preferred embodiment, the side surfaces of the ridge portions 15A and the side surfaces of the ridge coupling portions 15B are formed to be perpendicular to the front surface of the second nitride semiconductor layer 14, these side surfaces may instead be formed to inclined surfaces that are inclined with respect to the front surface of the second nitride semiconductor layer 14. That is, the lateral cross section of each ridge portion 15A may be of trapezoidal shape.

Although the preferred embodiments of the present invention have been described above, the present invention may be implemented in yet other preferred embodiments. For example, although with each of the preferred embodiments described above, silicon was taken up as an example of the material of the substrate 11, any substrate material besides this, such as a sapphire substrate, a GaN substrate, etc., may be applied.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2019-36271 filed on Feb. 28, 2019 in the Japan Patent Office, and the entire disclosure of this application is incorporated herein by reference.

REFERENCE SIGNS LIST 1, 1A, 1B, 1C Nitride semiconductor device
2 Semiconductor laminated structure
3 Source electrode
3A Source principal electrode portion
3B Extension portion
4 Gate electrode
4A Gate principal electrode portion
4B Base portion
5 Drain electrode
5A Drain principal electrode portion
5B Extension portion
6 Source contact hole
7 Drain contact hole
8 Active area
9 Nonactive area
10 Two-dimensional electron gas (2DEG)
11 Substrate
12 Buffer layer
13 First nitride semiconductor layer (electron transit layer)
14 Second nitride semiconductor layer (electron supply layer)
15 Nitride semiconductor gate layer
15A Ridge portion
15B Ridge coupling portion
16 Two-dimensional electron gas dividing groove
17 Passivation film
18 Gate insulating film
18A Principal insulating film portion
18B Principal insulating film coupling portion
20, 20A Gate portion
31 Gate layer material film
32 Gate electrode film
33 Resist pattern
34 Source/drain electrode film

The invention claimed is:

1. A nitride semiconductor device comprising: a first nitride semiconductor layer that constitutes an electron transit layer;
   a second nitride semiconductor layer that is formed on the first nitride semiconductor layer and constitutes an electron supply layer;
   a nitride semiconductor gate layer that is disposed on the second nitride semiconductor layer, has a ridge portion at least at a portion thereof, and contains an acceptor type impurity;
   a gate electrode that is disposed at least on the ridge portion of the nitride semiconductor gate layer;
   a source electrode that is disposed on the second nitride semiconductor layer and has a source principal electrode portion parallel to the ridge portion; and
   a drain electrode that is disposed on the second nitride semiconductor layer and has a drain principal electrode portion parallel to the ridge portion; and
   wherein a length direction of the ridge portion is a [110] direction of a semiconductor crystal structure that constitutes the second nitride semiconductor layer.

2. The nitride semiconductor device according to claim 1, wherein in plan view, the nitride semiconductor gate layer is disposed such as to surround the source principal electrode portion and
   the nitride semiconductor gate layer has a pair of the ridge portions that are respectively disposed at both sides of the source principal electrode portion and a ridge coupling portion that couples corresponding end portions of the ridge portions to each other.

3. The nitride semiconductor device according to claim 2, wherein the gate electrode has a pair of gate principal electrode portions that are respectively formed on the pair of ridge portions and a base portion that is formed on the ridge coupling portion and couples corresponding end portions of the pair of gate principal electrode portions to each other.

4. The nitride semiconductor device according to claim 3, wherein at both sides of the source principal electrode portion, the gate principal electrode portions and the drain principal electrode portions are disposed in that order from sides closer to the source principal electrode portion.

5. The nitride semiconductor device according to claim 2, wherein a ratio of an interval between the pair of ridges with respect to a length in a length direction of the ridges is not more than 1/100.

6. The nitride semiconductor device according to claim 2, wherein an inclination angle of opposing walls of two ridge coupling portions at both end sides of the pair of ridges is substantially equal to an inclination angle of lateral walls of the ridges.

7. The nitride semiconductor device according to claim 2, wherein a two-dimensional electron gas dividing portion is formed between an end portion of the source principal electrode portion and the corresponding ridge coupling portion inside a region in which the nitride semiconductor gate layer surrounds the source principal electrode portion.

8. The nitride semiconductor device according to claim 1, wherein an insulating film is interposed between the nitride semiconductor gate layer and the gate electrode.

9. The nitride semiconductor device according to claim 1, wherein a lateral wall along the length direction of the ridge is a (10-12) plane.

10. The nitride semiconductor device according to claim 1, wherein a lateral wall along the length direction of the ridge is an inclined surface that is inclined with respect to a front surface of the second nitride semiconductor layer and an inclination angle of the inclined surface with respect to the front surface of the second nitride semiconductor layer is not less than 80 degrees but less than 90 degrees.

11. The nitride semiconductor device according to claim 1, wherein a lateral wall along the length direction of the ridge is perpendicular to a front surface of the second nitride semiconductor layer.

12. The nitride semiconductor device according to claim 1, wherein the first nitride semiconductor layer is constituted of a GaN layer,
   the second nitride semiconductor layer is constituted of an $Al_xGa_{(1-x)}N$ ($0<x<1$) layer, and
   the nitride semiconductor gate layer is constituted of a p type GaN layer.

13. A method for manufacturing a nitride semiconductor device comprising: a first step of forming a first nitride semiconductor layer that constitutes an electron transit layer, a second nitride semiconductor layer that constitutes an electron supply layer, and a nitride semiconductor gate layer material film that contains an acceptor type impurity in that order on a substrate; a second step of forming a gate electrode film that is a material film of a gate electrode on the nitride semiconductor gate layer material film; a third step of patterning the gate electrode film and the nitride semiconductor gate layer material film by etching to form a nitride semiconductor gate layer that has a pair of mutually parallel ridge portions and a ridge coupling portion coupling corresponding end portions thereof to each other and a gate electrode that has a gate principal electrode portion formed on the ridge portions; and a fourth step of forming, on the electron supply layer, a source electrode that includes a source principal electrode portion disposed inside a region between the pair of ridge portions such as to be parallel to the ridge portions and at the same time forming a drain electrode that includes a drain principal electrode portion disposed inside a region at an outer side of the pair of ridge portions such as to be parallel to the ridge portions; and wherein a length direction of the ridge portions is a [110] direction of a semiconductor crystal structure that constitutes the second nitride semiconductor layer.

14. The method for manufacturing a nitride semiconductor device according to claim 13, wherein the second nitride semiconductor layer is constituted of an $Al_xGa_{(1-x)}N$ ($0<x<1$) layer.

15. The method for manufacturing a nitride semiconductor device according to claim 13, wherein, in the third step, the nitride semiconductor gate layer material film is patterned by dry etching.

16. The method for manufacturing a nitride semiconductor device according to claim 13, wherein, in the third step, the nitride semiconductor gate layer material film is patterned by dry etching and wet etching following the dry etching.

* * * * *